(12) United States Patent
You et al.

(10) Patent No.: US 11,626,373 B2
(45) Date of Patent: Apr. 11, 2023

(54) SEMICONDUCTOR PACKAGES INCLUDING ANTENNA PATTERN

(71) Applicant: Samsung Electronics Co., Ltd., Suwon-si (KR)

(72) Inventors: Se Ho You, Seoul (KR); Hyeong Seob Kim, Cheonan-si (KR); Seung Kon Mok, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 17/172,427

(22) Filed: Feb. 10, 2021

(65) Prior Publication Data

US 2021/0398924 A1  Dec. 23, 2021

(30) Foreign Application Priority Data

Jun. 17, 2020 (KR) .................. 10-2020-0073760

(51) Int. Cl.
| | |
|---|---|
| *H01Q 9/04* | (2006.01) |
| *H01L 23/66* | (2006.01) |
| *H01L 23/498* | (2006.01) |
| *H01L 23/00* | (2006.01) |
| *H01L 23/538* | (2006.01) |
| *H01L 23/552* | (2006.01) |
| *H01L 23/367* | (2006.01) |

(52) U.S. Cl.
CPC ............ *H01L 23/66* (2013.01); *H01L 23/367* (2013.01); *H01L 23/49811* (2013.01); *H01L 23/49833* (2013.01); *H01L 23/5383* (2013.01); *H01L 23/5389* (2013.01); *H01L 23/552* (2013.01); *H01L 24/16* (2013.01); *H01L 2223/6677* (2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 7,880,677 B2 | 2/2011 | Rofougaran et al. | |
| 9,196,951 B2 | 11/2015 | Baks et al. | |
| 9,337,526 B2 | 5/2016 | Hong et al. | |
| 9,917,368 B2 | 3/2018 | Garcia et al. | |
| 10,438,907 B2 | 10/2019 | Hu et al. | |
| 2019/0067219 A1* | 2/2019 | Laster | H01L 21/568 |
| 2019/0173167 A1 | 6/2019 | Ariumi | |
| 2020/0052404 A1 | 2/2020 | Eid et al. | |

* cited by examiner

*Primary Examiner* — Long Pham
(74) *Attorney, Agent, or Firm* — Harness, Dickey & Pierce, P.L.C.

(57) ABSTRACT

A semiconductor package having a thinner shape and including an antenna is provided. A semiconductor package comprises a first substrate, a second substrate on the first substrate and including a first face facing the first substrate and a second face opposite to the first face, a pillar extending from the second face of the second substrate to the first substrate, and a first semiconductor chip on the second face of the second substrate and connected to the pillar. The second substrate may include an antenna pattern, and the antenna pattern may be connected to the first semiconductor chip, and may be on the second face of the second substrate such that the antenna pattern is isolated from direct contact with the first semiconductor chip.

20 Claims, 22 Drawing Sheets

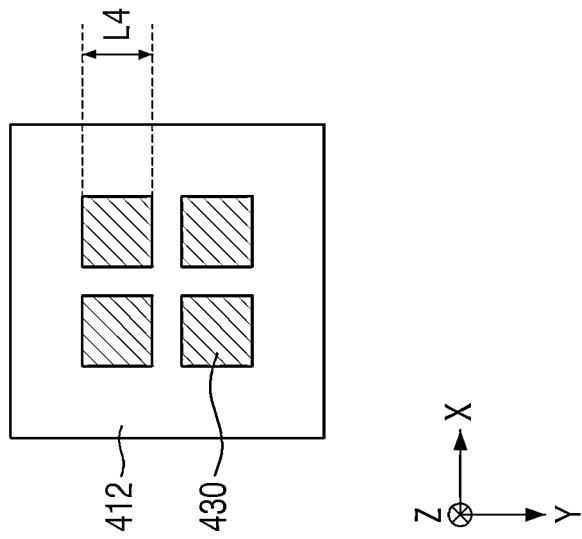

SEMICONDUCTOR PACKAGES INCLUDING ANTENNA PATTERN

CROSS-REFERENCE TO RELATED APPLICATIONS

This application claims priority from Korean Patent Application No. 10-2020-0073760 filed on Jun. 17, 2020 in the Korean Intellectual Property Office, the disclosure of which is incorporated herein by reference in its entirety.

BACKGROUND

1. Field

The inventive concepts relate to semiconductor packages including an antenna pattern. Specifically, the inventive concepts relate to semiconductor packages including an antenna (an antenna in package).

2. Description of the Related Art

A semiconductor package including an antenna (Antenna in Package, AIP) includes an antenna, and an RFIC chip (radio frequency IC chip) that transmits a signal to the antenna. The antenna and the RFIC chip may be electrically connected to each other. The antenna may radiate signals into the air. The antenna may be placed on the top of the semiconductor package to radiate the signal, without being affected by the medium.

The antenna substrate including the antenna may include complicated routing for radiating the signals, and the semiconductor package may have a thick shape accordingly. In addition, there may be a problem that a RFIC chip is disposed inside and heat is not radiated.

SUMMARY

Some example embodiments of the inventive concepts provide a semiconductor package having a thinner shape and including an antenna. The semiconductor package may also simplify the routing of the antenna and solve the heat dissipation problem of the RFIC chip.

Some example embodiments of the inventive concepts also provide a semiconductor package in which the heat radiation ability of a semiconductor chip is improved.

However, aspects of the inventive concepts are not restricted to aspects set forth herein. The above and other aspects of the inventive concepts will become more apparent to one of ordinary skill in the art to which the inventive concepts pertain by referencing the detailed description of the inventive concepts given below.

Specific details of some example embodiments are included in the detailed description and drawings.

According to some example embodiments of the inventive concepts, a semiconductor package may include: a first substrate; a second substrate on the first substrate, the second substrate including a first face facing the first substrate and a second face opposite to the first face; a pillar extending from the second face of the second substrate to the first substrate; and a first semiconductor chip on the second face of the second substrate and connected to the pillar. The second substrate may include an antenna pattern. The antenna pattern may be connected to the first semiconductor chip, and the antenna pattern may be on the second face of the second substrate such that the antenna pattern is isolated from direct contact with the first semiconductor chip.

According to some example embodiments, a semiconductor package may include: a first substrate; a second substrate on the first substrate, the second substrate including a first face facing the first substrate and a second face opposite to the first face; a first pillar and a second pillar extending from the second face of the second substrate to the first substrate; and a semiconductor chip on the second face of the second substrate, the semiconductor chip including a first signal terminal, a second signal terminal, and a power terminal. The second substrate may include an antenna pattern connected to the first signal terminal of the semiconductor chip. The first pillar may be connected to the power terminal, and the second pillar is connected to the second signal terminal.

According to some example embodiments, a semiconductor package may include: a first substrate including a first face and a second face opposite to each other; a plurality of connection terminals on the first face of the first substrate; a first semiconductor chip and a passive element on the second face of the first substrate; a molded layer which covers the first semiconductor chip and the passive element, the molded layer being on the second face of the first substrate; a second substrate on the molded layer, the second substrate including a third face facing the molded layer and a fourth face opposite to the third face; a plurality of pillars extending from the fourth face of the second substrate to the second face of the first substrate to penetrate the second substrate and the molded layer; and a second semiconductor chip on the fourth face of the second substrate and connected to the plurality of pillars. A first pillar of the plurality of pillars may be connected to the first semiconductor chip and the passive element through the first substrate. A second pillar of the plurality of pillars may be connected to one connection terminal of the plurality of connection terminals through the first substrate. The second substrate may include an antenna pattern, a ground pattern, and wiring. The antenna pattern may be connected to the second semiconductor chip through the wiring, and the antenna pattern may be on the fourth face of the second substrate to be isolated from direct contact with the second semiconductor chip. The ground pattern may be in the second substrate.

According to some example embodiments, a semiconductor package may include: a first substrate including a first face and a second face opposite to each other; a molded layer which covers the second face of the first substrate; a pillar penetrating the molded layer and the first substrate; a semiconductor chip on the molded layer and connected to the pillar; and an antenna pattern on the first face of the first substrate and connected to the pillar.

According to some example embodiments, a semiconductor package may include: a first substrate; a second substrate on the first substrate, the second substrate including a first face facing the first substrate and a second face opposite to the first face; a molded layer between the first substrate and the second substrate; a pillar extending from the second face of the second substrate to the first substrate to penetrate the second substrate and the molded layer; and a first semiconductor chip on the second face of the second substrate and connected to the pillar. The second substrate may include an antenna pattern connected to the first semiconductor chip. A length of the pillar may be equal to or greater than a thickness of the molded layer.

BRIEF DESCRIPTION OF THE DRAWINGS

The above and other aspects and features of the present inventive concepts will become more apparent by describing in detail some example embodiments thereof with reference to the attached drawings, in which:

FIG. 22 is a diagram of the semiconductor package of FIG. 21 as seen from below.

DETAILED DESCRIPTION

Hereinafter, some example embodiments according to the technical idea of the inventive concepts will be described with reference to the accompanying drawings.

An electronic device 1 including a semiconductor package 100 including an antenna pattern 270 will be described below with reference to FIGS. 1 to 7.

Figure 1:
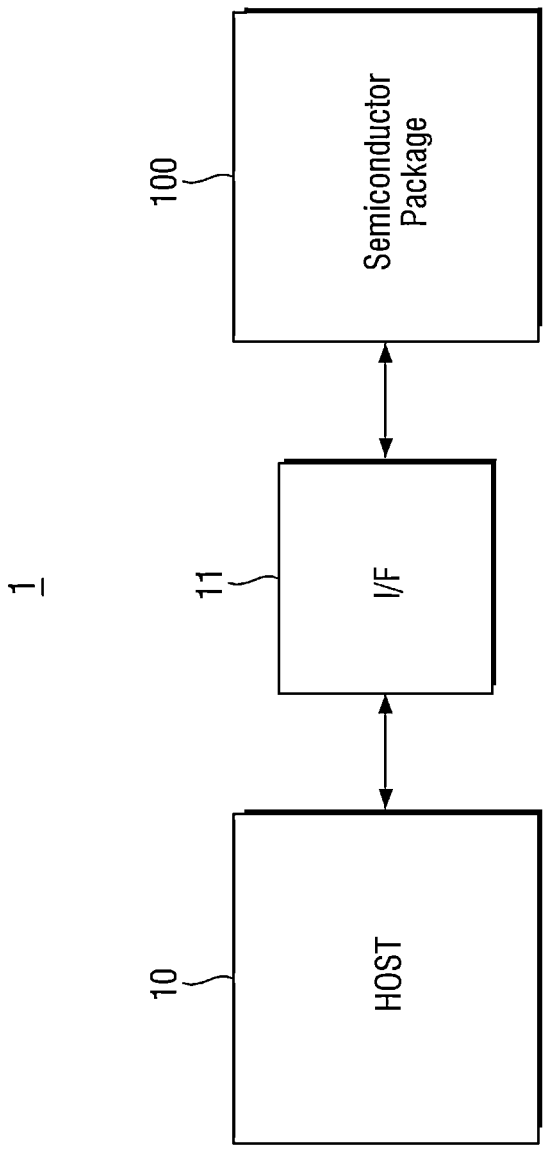
FIGS. 1 and 2 are diagrams for explaining an electronic device according to some example embodiments of the inventive concepts.
Figure 2:
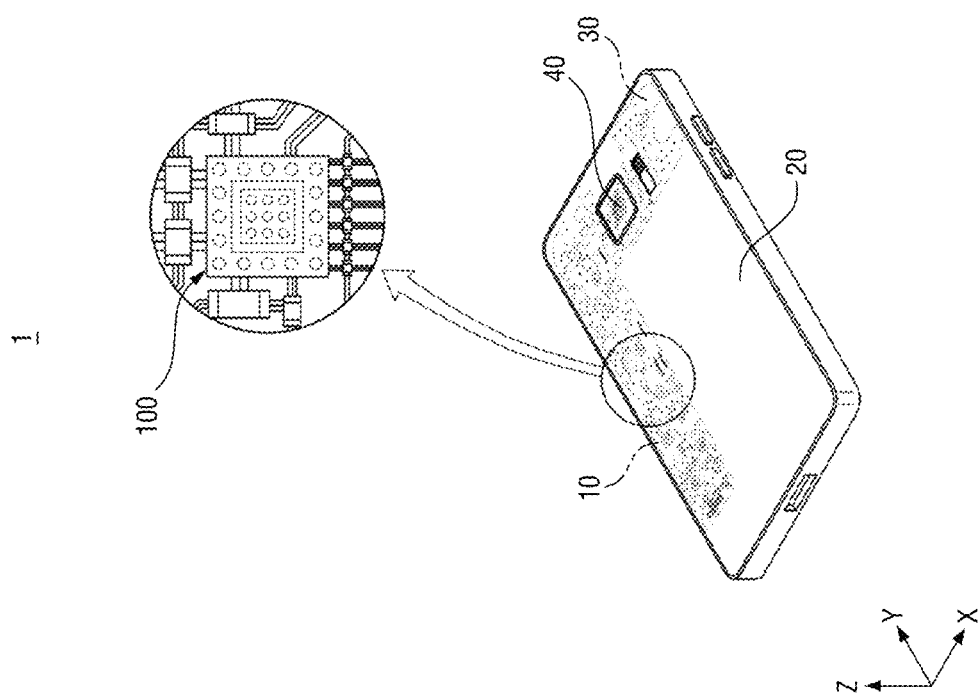
Figure 3:
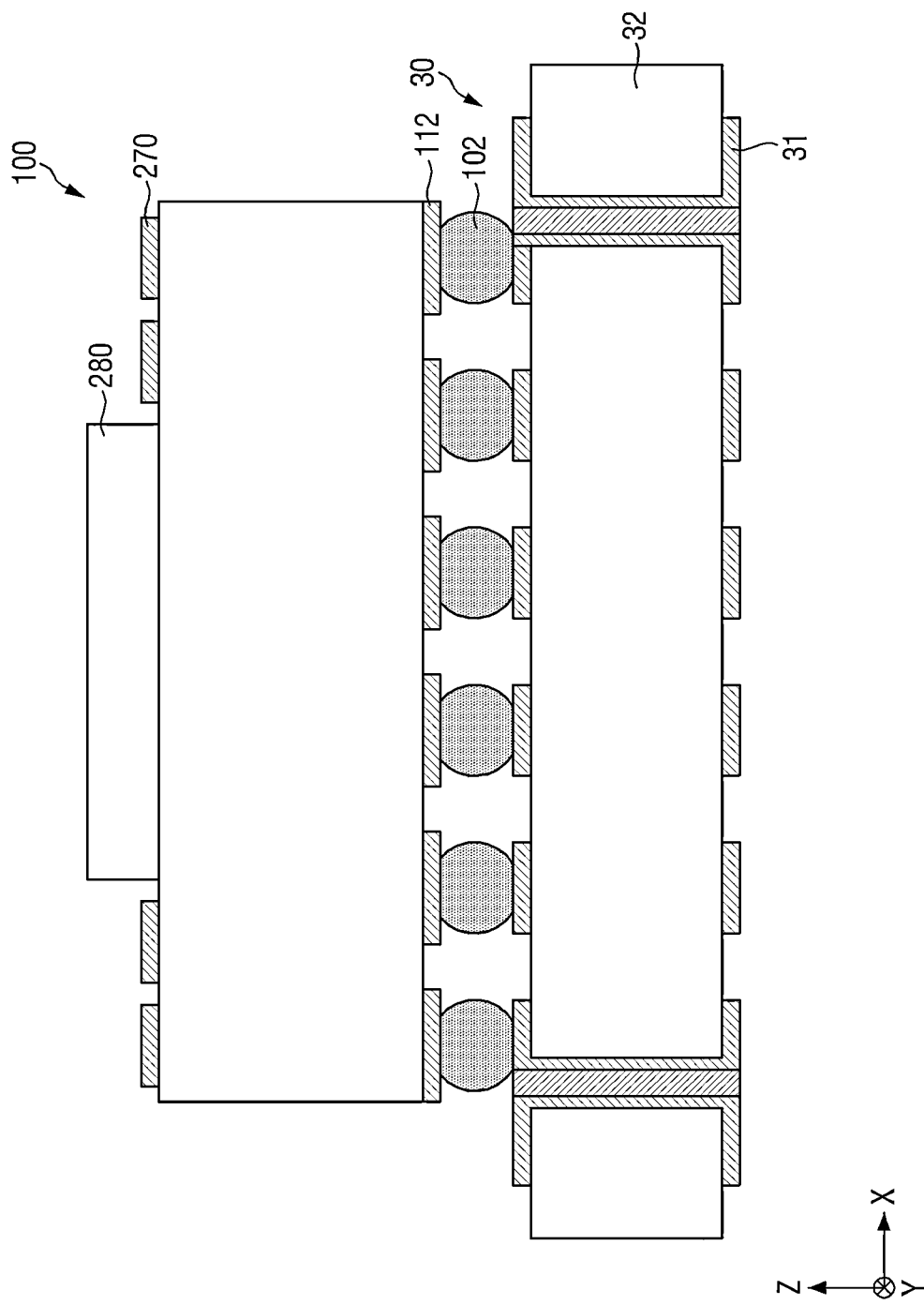
FIG. 3 is a diagram for explaining the semiconductor package and a main board of FIG. 2.
Figure 4:
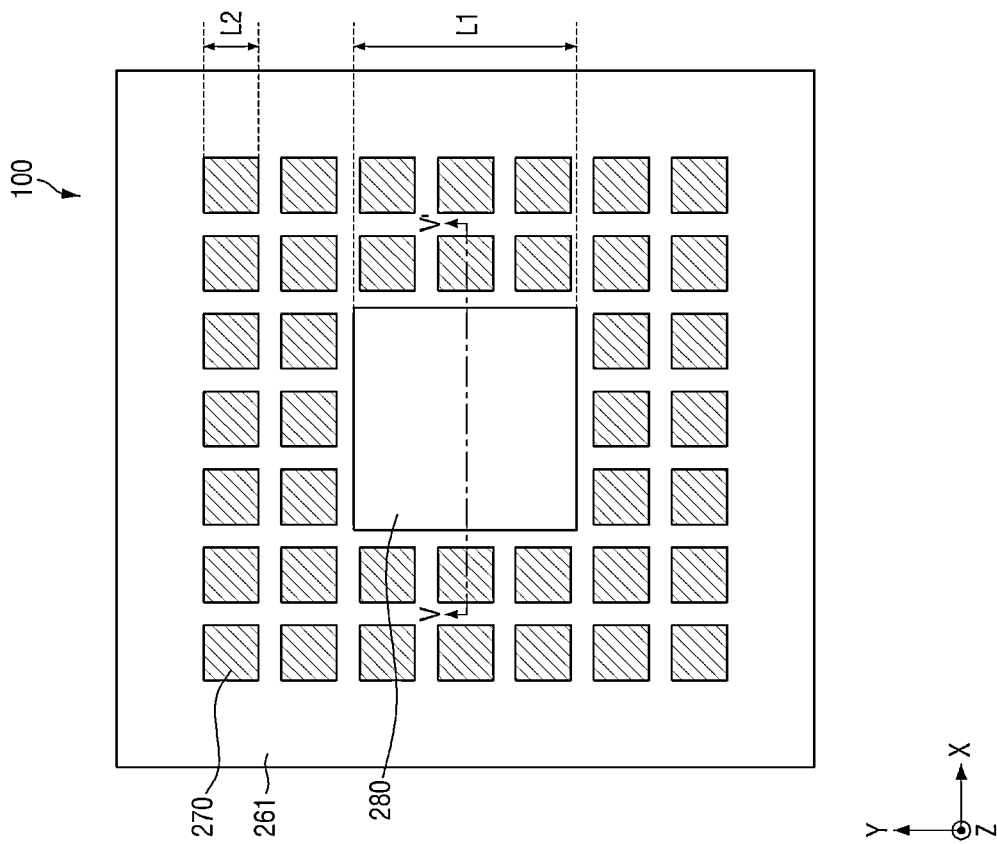
FIG. 4 is a diagram of the semiconductor package of FIG. 3 as viewed from top.
Figure 5:
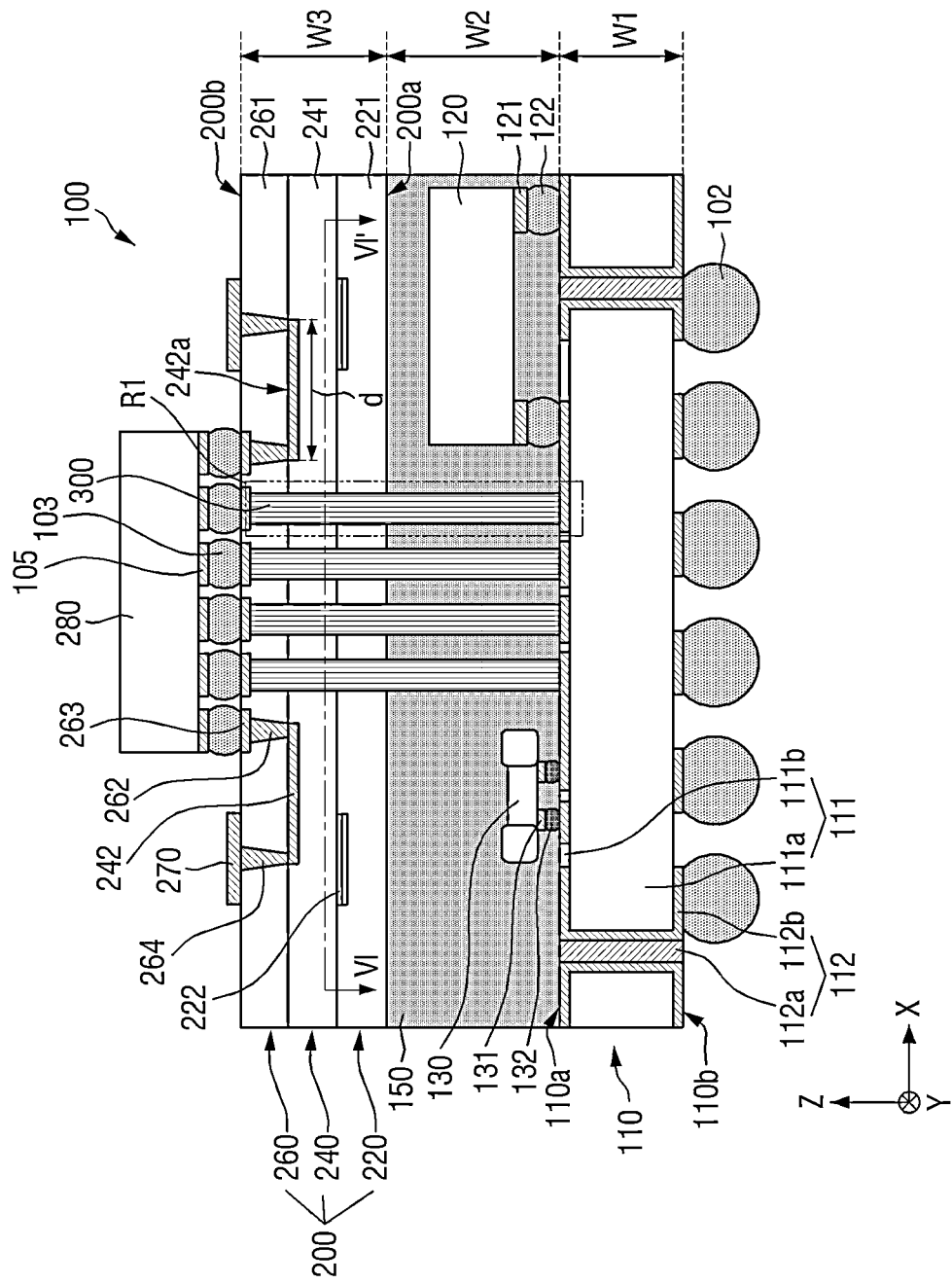
FIG. 5 is a cross-sectional view for explaining the semiconductor package taken along a line V-V' of FIG. 4.
Figure 6:
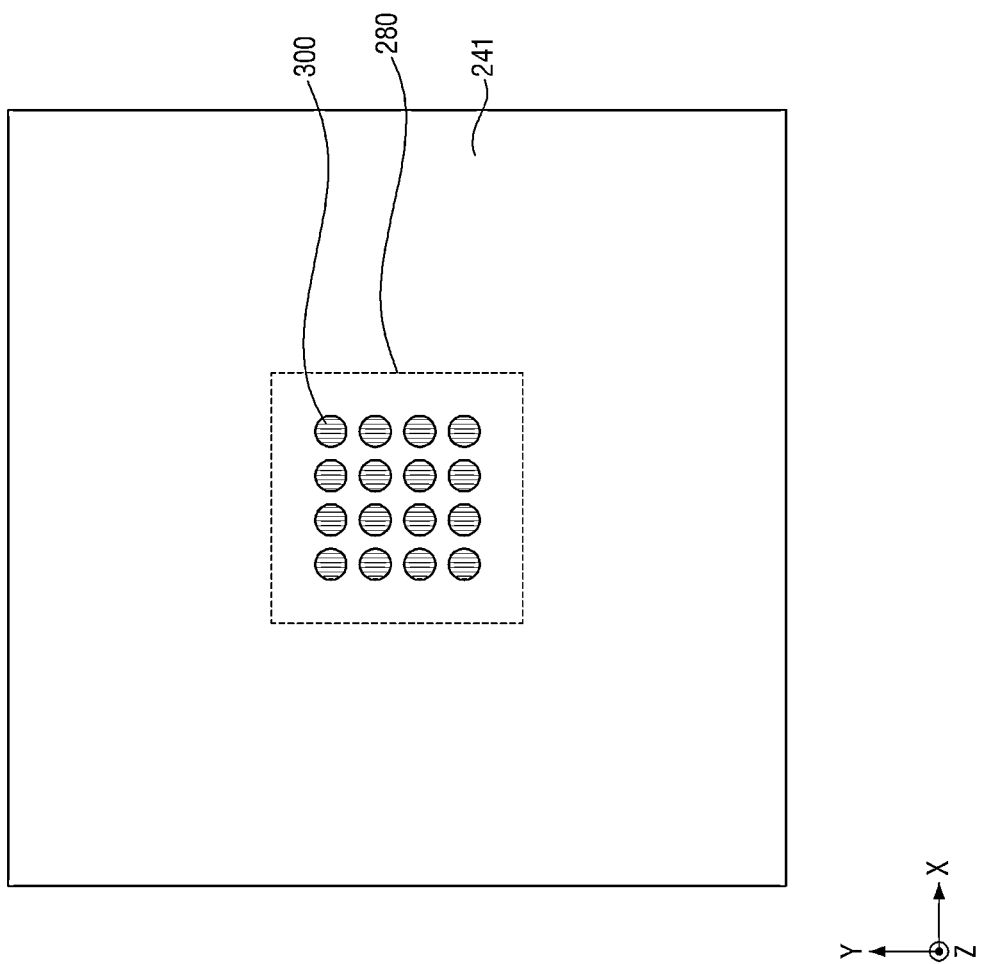
FIG. 6 is a cross-sectional view for explaining the semiconductor package taken along a line VI-VI' of FIG. 5.
Figure 7:
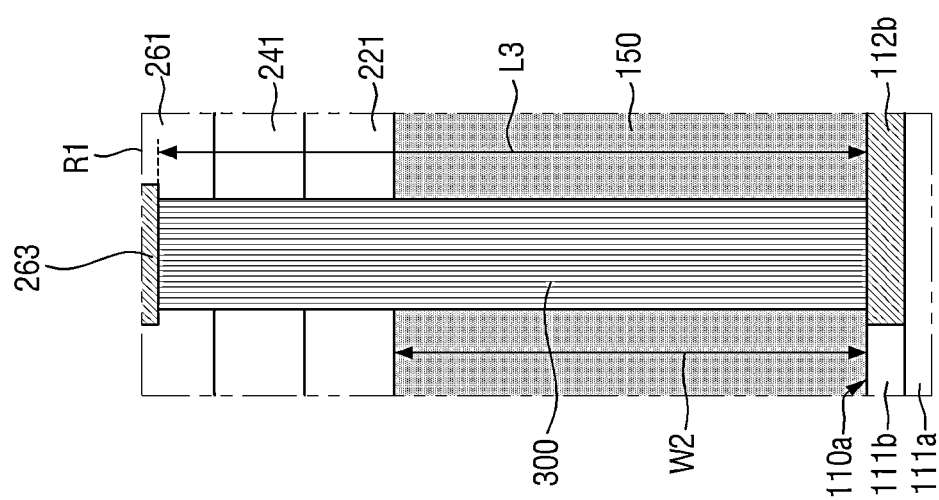
FIG. 7 is an enlarged view of a region R1 of FIG. 5.

FIGS. 1 and 2 are diagrams for explaining an electronic device according to some example embodiments of the inventive concepts. FIG. 3 is a diagram for explaining the semiconductor package and a main board of FIG. 2. FIG. 4 is a diagram of the semiconductor package of FIG. 3 as viewed from top. FIG. 5 is a cross-sectional view for explaining the semiconductor package taken along a line V-V' of FIG. 4. FIG. 6 is a cross-sectional view for explaining the semiconductor package taken along a line VI-VI' of FIG. 5. FIG. 7 is an enlarged view of a region R1 of FIG. 5.

Referring to FIG. 1, the electronic device 1 may include a host 10, an interface 11 and a semiconductor package 100.

In some example embodiments, the host 10 may be connected to the semiconductor package 100 through the interface 11. For example, the host 10 may transmit the signal to the semiconductor package 100 to control the semiconductor package 100. Further, for example, the host 10 may receive the signal from the semiconductor package 100 and process the data included in the signal.

For example, the host 10 may include a central processing unit (CPU), a controller, an application specific integrated circuit (ASIC), and the like. In addition, for example, the host 10 may include a memory chip such as a DRAM (Dynamic Random Access Memory), a SRAM (Static RAM), a PRAM (Phase-change RAM), a MRAM (Magneto resistive RAM), a FeRAM (Ferroelectric RAM) and a RRAM (Resistive RAM).

Referring to FIGS. 1 and 2, the electronic device 1 may include a host 10, a body 20, a main board 30, a camera module 40 and a semiconductor package 100.

The main board 30 (e.g., a printed circuit board, or PCB) may be mounted in the body 20 of the electronic device 1. The host 10, the camera module 40 and the semiconductor package 100 may be mounted on the main board 30. The host 10, the camera module 40 and the semiconductor package 100 may be electrically connected to each other by the main board 30. For example, the interface 11 may be implemented by (e.g., included in) the main board 30.

The host 10 and the semiconductor package 100 are electrically connected to each other by the main board 30 to transmit and receive signals.

Referring to FIG. 3, the semiconductor package 100 may be disposed on the main board 30. For example, a connection terminal 102 may be disposed on the main board 30, and the semiconductor package 100 may be disposed on the connection terminal 102.

The main board 30 may be a printed circuit board (PCB), a ceramic substrate, a glass substrate, an interposer substrate, or the like. However, some example embodiments according to the technical idea of the inventive concepts are not limited thereto, and for convenience of explanation, the main board 30 will be explained on the assumed that it is a printed circuit board.

The main board 30 may include a wiring structure 31 and a core 32. The core 32 may include a CCL (Copper Clad Laminate), a PPG, an ABF (Ajimoto Build-up Film), epoxy, polyimide and the like. The wiring structure 31 may include, but is not limited to, at least one of copper (Cu), aluminum (Al), silver (Ag), tin (Sn), gold (Au), nickel (Ni), lead (Pb), titanium (Ti), or alloys thereof.

The core 32 may be disposed at a central part of the main board 30, and the wiring structure 31 may be disposed above and below the core 32. The wiring structure 31 may be disposed above and below the main board 30 to be exposed.

Further, the wiring structure 31 may be disposed to penetrate the core 32. The wiring structure 31 may electrically connect elements which come into contact with the main board 30. For example, the wiring structure 31 may electrically connect the semiconductor package 100 and the host 10. That is, the wiring structure 31 may electrically connect the semiconductor package 100 and the host 10 electrically connected through the connection terminal 102.

Referring to FIGS. 4 and 5, the semiconductor package 100 may include a first substrate 110, a second semiconductor chip 120, a connection pad 121, a connection terminal 122, a passive element 130, a connection pad 131, a connection terminal 132, a molded layer 150, a second substrate 200, an antenna pattern 270, a first semiconductor chip 280, a connection terminal 103, a connection pad 105 and a pillar 300. The semiconductor package 100 may be a semiconductor package including the antenna pattern 270. That is to say, the semiconductor package 100 may be a semiconductor package including an antenna (for example, an antenna in package, AIP). However, some example embodiments according to the technical idea of the inventive concepts are not limited thereto.

Referring to FIG. 5, the first substrate 110 may be a printed circuit board (PCB), a ceramic substrate, a glass substrate, an interposer substrate, or the like. However, some example embodiments according to the technical idea of the inventive concepts are not limited thereto, and for convenience of explanation, the first substrate 110 will be explained on the assumption that it is a printed circuit board.

The first substrate 110 may include a core 111 and a wiring structure 112. The core 111 (including one or both of the first portion 111a or the second portion 111b) may include a CCL (Copper Clad Laminate), a PPG, an ABF (Ajimoto Build-up Film), epoxy, polyimide and the like. The wiring structure 112 (including one or both of the wiring structure layer(s) 112b or the through via 112a) may include a material that may include, but is not limited to, at least one of copper (Cu), aluminum (Al), silver (Ag), tin (Sn), gold (Au), nickel (Ni), lead (Pb), titanium (Ti), or alloys thereof. As shown in FIGS. 5 and 7, the core 111 may include a first portion 111a having surfaces on which the wiring structure 112 is located and one or more second portions 111b at least partially surrounding side surfaces of the wiring structure 112. The first and second portions 111a and 111b may be separate structures that may be formed of separate materials or may be separate portions of a single, continuous piece of material. As shown in at least FIG. 5, the third face 110a may be at least partially defined by the second portion 111b of the core 111. In some example embodiments, including the example embodiments shown in at least FIG. 5, for example where the core 111 and the wiring structure 112 are considered to be part of, or included in the first substrate 110, some or all of one or more surfaces of the wiring structure 112 and/or the core 111 may be understood to at least partially define the third face 110a of the first substrate 110, such that the third face 110a may be at least partially collectively defined by surfaces (e.g., coplanar upper surfaces and/or exposed upper surfaces) of the core 111 (e.g., at least a portion of one or more upper surfaces of the second portion 111b and/or the first portion 111a) and/or the wiring structure 112 (e.g., at least a portion of one or more upper surfaces of the wiring structure 112). In some example embodiments, including the example embodiments shown in at least FIG. 5, for example where the core 111 and the wiring structure 112 are considered to be part of, or included in the first substrate 110, some or all of one or more surfaces of the wiring structure 112 and/or the core 111 may be understood to at least partially define the fourth face 110b of the first substrate 110, such that the fourth face 110b may be at least partially collectively defined by surfaces (e.g., copla-nar lower surfaces and/or exposed lower surfaces) of the core 111 (e.g., at least a portion of one or more lower surfaces of the second portion 111b and/or the first portion 111a) and/or the wiring structure 112 (e.g., at least a portion of one or more lower surfaces of the wiring structure 112). In some example embodiments, the upper surface of the first portion 111a of the core 111, which may be covered by the second portion 111b and the wiring structure 112, may at least partially define and/or be referred to as the third face 110a. In some example embodiments, the lower surface of the first portion 111a of the core 111 may at least partially define and/or be referred to as the fourth face 110b.

The core 111 may be disposed at the center part of the first substrate 110, and the wiring structure 112 may be disposed above and below the core 111. The wiring structure 112 may be disposed above and below the first substrate 110 to be exposed. As shown in FIG. 5, in some example embodiments, for example where the wiring structure 112 is considered to be included in the first substrate 110, a part of the wiring structure 112 (e.g., one or more upper surfaces thereof) may be exposed on the third face 110a of the first substrate 110 (e.g., may at least partially define the third face 110a), and the wiring structure 112 may be connected to one or more pillars 300.

In addition, the wiring structure 112 may be disposed to penetrate the core 111. The wiring structure 112 may electrically connect a terminal coming into contact with the lower part of the first substrate 110 and a terminal coming into contact with the upper part of the first substrate 110. For example, the wiring structure 112 may connect a connection terminal 102 coming into contact with the lower part of the first substrate 110, and the pillar 300, the second semiconductor chip 120 and the passive element 130 that come into contact with the upper part of the first substrate 110. The first substrate 110 may be connected to the main board 30 through the connection terminals 102.

The second semiconductor chip 120 may be between the first substrate 110 and the second substrate 200 (e.g., may be covered by and/or enclosed within a volume space defined by outer surfaces of the molding layer 150) and may be disposed on an upper face (e.g., third face 110a) of the first substrate 110. That is, the second semiconductor chip 120 may be disposed on a surface opposite to a surface of the first substrate 110 on which the connection terminal 102 is disposed (e.g., the fourth face 110b). The second semiconductor chip 120 may be connected to the first substrate 110 through the connection pad 121 and the connection terminal 122. The second semiconductor chip 120 may be connected to the first semiconductor chip 280, as shown in at least FIG. 5, through at least a pillar 300 and the first substrate 110 (e.g., at least a portion of the wiring structure 112 of the first substrate 110) and may be further connected to the first semiconductor chip 280, as shown in FIG. 5, through the connection pad 121 and the connection terminal 122, and the connection pad 105 and the connection terminal 103, in addition to the first substrate 110 and the pillar 300.

The second semiconductor chip 120 may include, for example, a power management integrated circuit (PMIC). The second semiconductor chip 120 may provide the power required by the first semiconductor chip 280. The second semiconductor chip 120 may adjust the power to be provided to the first semiconductor chip 280. However, some example embodiments according to the technical idea of the inventive concepts are not limited thereto, and the second semiconductor chip 120 may include a memory chip such as a volatile memory, a non-volatile memory and a flash memory, or may include a processer chip such as a central processing unit (CPU), a controller, an application specific integrated circuit (ASIC), a graphic processor (GPU), a digital signal processor, an encryption processor, a microprocessor, and a microprocessor.

The passive element 130 may be disposed on the upper face (e.g., third face 110a) of the first substrate 110. That is, the passive element 130 may be disposed on the surface opposite to the surface of the first substrate 110 on which the connection terminal 102 is disposed (e.g., the fourth face 110b). The passive element 130 may be connected to the first substrate 110 through the connection pad 131 and the connection terminal 132.

The passive element 130 may include, for example, a resistor, an inductor, a capacitor, or the like. However, some example embodiments according to the technical idea of the inventive concepts are not limited thereto.

The connection terminal 102, the connection terminal 122 and the connection terminal 132 may include, but are not limited to, solder balls or conductive bumps. For example, the connection terminal 102 and the connection terminal 122 may include one solder ball. For example, the connection terminals 132 may include a plurality of solder balls (e.g., two solder balls or two terminals).

The connection pad 121 and the connection pad 131 may include, but are not limited to, a metal material. The connection pad 121 may electrically connect the second semiconductor chip 120 and the connection terminal 122. The connection pad 131 may electrically connect the passive element 130 and the connection terminal 132. For example, the connection pad 121 may be of one type, but the connection pad 131 may be of a plurality of types.

A molded layer 150 may be formed on the upper face (e.g., third face 110a) of the first substrate 110. The molded layer 150 may cover the upper face of the first substrate 110. The molded layer 150 may fill a space between the first substrate 110 and a second substrate 200 to be described below, such that the molded layer 150 may, in some example embodiments, be directly between (and in direct contact at opposite surfaces with) the first substrate 110 and the second substrate 200. In some example embodiments, the molded layer 150 may be indirectly between the first substrate 110 and the second substrate 200 so as to be isolated from direct contact with one or both of the first substrate 110 or the second substrate 200 in the third direction Z by one or more interposing spaces or structures. The molded layer 150 may cover the second semiconductor chip 120, the connection pad 121 and the connection terminal 122.

The molded layer 150 may cover the passive element 130, the connection pad 131 and the connection terminal 132.

The molded layer 150 may be formed to protect the second semiconductor chip 120, the passive element 130, and a pillar 300 to be described later. The molded layer 150 may be formed to wrap the pillar 300, for example such that the pillar 300 may be understood to penetrate the molded layer 150 (e.g., in the third direction Z) and may be further understood to penetrate the second substrate 200.

The molded layer 150 may include an epoxy molding compound (EMC) or two or more kinds of silicon hybrid materials.

The second substrate 200 may be disposed on the first substrate 110. The second substrate 200 may be disposed on the molded layer 150. The second substrate 200 may be formed to cover the molded layer 150. The molded layer 150 may be formed to fill the space between the first substrate 110 and the second substrate 200.

As shown in at least FIG. 5, the second substrate 200 may have and/or include a first face 200a facing the first substrate 110 and a second face 200b opposite to the first face 200a, such that the first face 200a is proximate to the first substrate 110 in relation to the second face 200b.

As further shown in at least FIG. 5, the first substrate 110 may have and/or include a third face 110a facing the second substrate 200 and a fourth face 110b opposite to the third face 110a, such that the third face 110a is proximate to the second substrate 200 in relation to the fourth face 110b. Accordingly, the first and third faces 200a and 110a may be understood to be opposing faces in relation to each other, the first and second faces 200a and 200b may be understood to be opposite faces in relation to each other, the third and fourth faces 110a and 110b may be understood to be opposite faces in relation to each other, and the second and fourth faces 200b and 110b may be understood to be opposite faces in relation to each other.

As described herein, an element that is "on" another element may be above or beneath the other element. Additionally, an element that is "on" another element as described herein may be "directly on" the other element so as to be in direct contact with the other element or may be "indirectly on" the other element so as to be isolated from direct contact with the other element by one or more interposing spaces or structures.

As described herein, an element that is "in" or "within" another element may be within a volume space that is defined by outer surfaces or faces of the other element, such that the element in the other element may be at least partially or completely enclosed within the other element.

The second substrate 200 may include a first sub-substrate 220, a second sub-substrate 240 and a third sub-substrate 260. The first sub-substrate 220 may be disposed on the molded layer 150 to cover the molded layer 150. The second sub-substrate 240 may be disposed on the first sub-substrate 220. The third sub-substrate 260 may be disposed on the second sub-substrate 240. Although only three sub-substrates 220, 240 and 260 are shown in the drawing, some example embodiments according to the technical idea of the inventive concepts are not limited thereto, and the second substrate 200 may include more sub-substrates.

The first sub-substrate 220 may include a first insulating layer 221 and a ground pattern 222. The first insulating layer 221 may include an insulating material. For example, the first insulating layer 221 may include, but is not limited to, silicon oxide. The ground pattern 222 may include a metal material. For example, the ground pattern 222 may include conductive materials such as copper (Cu), aluminum (Al), silver (Ag), tin (Sn), gold (Au), nickel (Ni), lead (Pb), titanium (Ti), or alloys thereof.

As shown in at least FIG. 5, the antenna pattern 270 may be understood to be included in (e.g., as a part of) the second substrate 200, such that the second substrate 200 may be understood to include the antenna pattern 270. As shown in at least FIG. 5, the antenna pattern 270 may be on (e.g., directly or indirectly on) the second face 200b of the second substrate 200.

The ground pattern 222 may be a reflector. For example, the ground pattern 222 may reflect the signal radiated from the antenna pattern 270. For example, the signal radiated from the antenna pattern 270 may be reflected by the ground pattern 222 and radiated into the air. The signal may be radiated by the antenna pattern 270 and the ground pattern 222.

Although the ground pattern 222 may have a plate-like shape, some example embodiments according to the technical idea of the inventive concepts are not limited thereto.

The ground pattern 222 may be disposed on the upper face of the first insulating layer 221. For example, as shown in FIG. 5, the ground pattern 222 may be formed so that the upper face of the ground pattern 222 is exposed on the upper face of the first insulating layer 221.

The second sub-substrate 240 may include a second insulating layer 241 and a wiring 242. The second insulating layer 241 may include an insulating material. For example, the second insulating layer 241 may include, but is not limited to, silicon oxide. The wiring 242 may include a metal material. For example, the wiring 242 may include a conductive material such as copper (Cu), aluminum (Al), silver (Ag), tin (Sn), gold (Au), nickel (Ni), lead (Pb), titanium (Ti) or alloys thereof.

Although the wiring 242 may have a shape extending in a first direction X, the wiring 242 may have a shape extending in a second direction Y, without being limited thereto.

The wiring 242 may be disposed on the upper face of the second insulating layer 241. For example, the wiring 242 may be formed so that the upper face 242a of the wiring 242 is exposed on the upper face of the second insulating layer 241.

It will be understood that the second substrate 200 may be considered to include the wiring via 264 and the ground pattern 222, where the wiring 242 and the ground pattern 222 are at least partially within an interior of the second substrate 200 (e.g., enclosed within a volume space defined by outer surfaces (e.g., first and second faces 200a and 200b) of the second substrate 200), such that the wiring 242 and the ground pattern 222 are isolated from exposure to an exterior of the second substrate 200. However, example embodiments are not limited thereto, and in some example embodiments one or more faces of the wiring 242 and/or the ground pattern 222 may be exposed on one or more outer faces (e.g., first face 200a and/or second face 200b) of the second substrate 200.

The third sub-substrate 260 may include a third insulating layer 261, a wiring via 262, a connection pad 263, and a wiring via 264. The third insulating layer 261 may include an insulating material. For example, the third insulating layer 261 may include, but is not limited to, silicon oxide.

The wiring via 262, the connection pad 263, and the wiring via 264 may include a metal material. For example, the wiring via 262, the connection pad 263, and the wiring via 264 may include a conductive material such as copper (Cu), aluminum (Al), silver (Ag), tin (Sn), gold (Au), nickel (Ni), lead (Pb), titanium (Ti), or alloys thereof.

The wiring via 262 and the wiring via 264 may have a shape extending in a third direction Z. That is, the wiring via 262 and the wiring via 264 may have a shape of a via that penetrates the third insulating layer 261 in the third direction Z. The wiring via 264 may be formed so that the upper face of the wiring via 264 is exposed on the upper face of the third insulating layer 261.

The connection pad 263 may be disposed on the upper face of the wiring via 262. The connection pad 263 may be electrically connected to the wiring via 262. The connection pad 263 may be formed such that the upper face of the connection pad 263 is exposed on the upper face of the third insulating layer 261. Although the connection pad 263 is shown as being disposed in the third insulating layer 261 in FIG. 5, some example embodiments according to the technical idea of the inventive concepts are not limited thereto. The connection pad 263 may be disposed to protrude from the third insulating layer 261.

The wiring via 262 may be in contact with and electrically connected to the wiring 242. The wiring via 264 may be in contact with and electrically connected to the wiring 242. That is, the connection pad 263, the wiring via 262, the wiring 242 and the wiring via 264 may be electrically connected to each other accordingly. Accordingly, as shown in FIG. 5, the antenna pattern 270 and the first semiconductor chip 280 may be connected by at least the wiring 242.

The pillar 300 may be formed to penetrate the second substrate 200 and the molded layer 150. For example, the pillar 300 may be formed to vertically (e.g., in the third direction Z) penetrate the first to third sub-substrates 220, 240 and 260 and the molded layer 150. The pillar 300 may penetrate the second substrate 200 and the molded layer 150 in the third direction Z. As shown in FIG. 5, the pillar 300 may extend from the second face 200b of the second substrate 200 to the first substrate 110. As shown in at least FIG. 5, the pillar 300 may be connected to the third face 110a of the first substrate 110.

Referring to FIG. 6, a plurality of pillars 300 may be disposed. That is, the pillars 300 may be a plurality of pillars that penetrates the second substrate 200 and the molded layer 150 and to which the first semiconductor chip 280 is connected. Although the pillar 300 is shown as a cylindrical shape, some example embodiments according to the technical idea of the inventive concepts are not limited thereto.

Although the pillars 300 may be located at the central part of the second substrate 200 and the molded layer 150, some example embodiments according to the technical idea of the inventive concepts are not limited thereto.

The pillar 300 may include a conductive material, such as copper (Cu), aluminum (Al), silver (Ag), tin (Sn), gold (Au), nickel (Ni), lead (Pb), titanium (Ti), or alloys thereof.

Referring to FIG. 7, the length of the pillar 300 may be a third length L3. The third length L3 may be 100 um or more. However, some example embodiments according to the technical idea of the inventive concepts are not limited thereto, and the third length L3 may be less than 100 um. For example, the pillar 300 may be a long pillar.

The pillar 300 may be formed by various processes. For example, the pillar 300 may be formed by depositing a metal on the trenches of the second substrate 200 and the molded layer 150 formed by etching, through a process such as deposition. Further, for example, the pillar 300 may be formed by inserting the pillar 300 into the trenches of the second substrate 200 and the molded layer 150 which are formed by etching. However, some example embodiments according to the technical idea of the inventive concepts are not limited thereto, and the pillar 300 may be formed by another process.

Referring to FIG. 5 again, the thickness of the first substrate 110 may be a first thickness W1, the thickness of the molded layer 150 may be a second thickness W2, and the thickness of the second substrate 200 may be a third thickness W3. The third thickness W3, which is the thickness of the second substrate 200 (e.g., in the third direction Z as shown in FIG. 5), may be smaller than the first thickness W1, which is the thickness of the first substrate 110 (e.g., in the third direction Z as shown in FIG. 5).

The third length L3 (e.g., in the third direction Z as shown in FIG. 7), which is the length of the pillar 300, may be equal to or greater than the second thickness W2 (e.g., in the third direction Z as shown in FIG. 7), which is the thickness of the molded layer 150 (e.g., in the third direction Z as shown in FIG. 7). Also, the third length L3, which is the length of the pillar 300, may be substantially the same as the sum of the second thickness W2 and the third thickness W3.

The third length L3 (e.g., in the third direction Z), which is the length of the pillar 300, may be equal to or greater than a distance d of the wiring 242 in the first direction X. Said distance d may be considered to be the same or approximately the same as a distance (e.g., a distance in the first direction X) between a first signal terminal of the first semiconductor chip 280 and the antenna pattern 270 that is connected to the first signal terminal through at least the wiring 242. However, some example embodiments according to the technical idea of the inventive concepts are not limited thereto, and the third length L3, which is the length of the pillar 300, may be smaller than the distance d of the wiring 242 in the first direction X. Since the distance d of the wiring 242 in the first direction X is smaller than the third length L3 which is the length of the pillar 300, the signal to be transmitted may not be attenuated. Where the semiconductor package 100 includes multiple pillars 300 (e.g., a first pillar and a second pillar according to any of the example embodiments), the distanced of the wiring 242 (e.g., a distance (e.g., a distance in the first direction X) between a first signal terminal of the first semiconductor chip 280 and the antenna pattern 270 may be smaller than a length L3 of at least one of the first pillar or the second pillar.

The pillar 300 may be connected to the upper face of the first substrate 110. That is, the pillar 300 may be connected to the surface opposite to the surface on which the connection terminals 102 are disposed on the first substrate 110. For example, the pillar 300 may be electrically connected to the wiring structure 112. As a result, the pillar 300 may be electrically connected to the second semiconductor chip 120 and the passive element 130 through the wiring structure 112. As shown in at least FIG. 5, the wiring structure 112 may include a through via 112a that penetrates the core 111 of the first substrate 110 and one or more wiring structure layers 112b which may comprise a same or different material as the through via 112a, where said same or different material may be understood to be a material of the wiring structure 112.

The connection terminal 103 and the connection pad 105 may be disposed on the second substrate 200. For example, the connection terminal 103 may be disposed on the connection pad 263. The connection terminal 103 may include, but is not limited to, solder balls or conductive bumps. The connection pads 105 may be disposed on the respective connection terminals 103. The connection pad 105 may include, but is not limited to, conductive materials such as copper (Cu), aluminum (Al), silver (Ag), tin (Sn), gold (Au), nickel (Ni), lead (Pb), titanium (Ti), or alloys thereof.

The connection terminal 103 and the connection pad 105 may be electrically connected to the pillar 300 and the antenna pattern 270 through the connection pad 263. Accordingly, it will be understood that the antenna pattern 270 may be connected to the first semiconductor chip 280 (e.g., via wiring 242, wiring via 262, a connection pad 263, a connection terminal 103, and a connection pad 105).

The first semiconductor chip 280 may be disposed on the second substrate 200, for example on the second face 200b of the second substrate 200 as shown in at least FIG. 5. As shown in FIG. 5, the first semiconductor chip 280 may be indirectly above the second face 200b of the second substrate 200, with at least a connection terminal 103 interposing therebetween, but example embodiments are not limited thereto. The first semiconductor chip 280 may be disposed to overlap, e.g., in the third direction Z, the pillar 300, the wiring via 262, the connection pad 263, the connection terminal 103 and the connection pad 105. For example, the first semiconductor chip 280 may be disposed on the connection terminal 103 and the connection pad 105. The first semiconductor chip 280 may be electrically connected to the connection terminal 103 and the connection pad 105. That is, the first semiconductor chip 280 may be electrically connected to the pillar 300 and the antenna pattern 270 through the connection terminal 103 and the connection pad 105. However, some example embodiments according to the technical idea of the inventive concepts are not limited thereto, and the first semiconductor chip 280 may be directly connected through the connection pad 263, without the connection terminal 103 and the connection pad 105.

As described herein, an element that overlaps another element (e.g., in an overlapping direction) may partially overlap the other element (such that at least a portion of each of the element and the other element do not overlap each other in the overlapping direction) or completely overlap the other element (such that one or both of the element or the other element is completely overlapped in the overlapping direction by the other of the element or the other element).

The first semiconductor chip 280 may be and/or may include an RFIC (radio frequency integrated circuit) chip. The first semiconductor chip 280 may convert an IF (intermediate frequency) signal received through the pillar 300 into an RF (radio frequency) signal. Also, the first semiconductor chip 280 may convert the RF signal, which is received through the antenna pattern 270, into the IF signal. The first semiconductor chip 280 may provide an RF signal to the antenna pattern 270 and the ground pattern 222. The first semiconductor chip 280 may provide the IF signal to the host 10 through the pillar 300 and the main board 30.

The first semiconductor chip 280 may be electrically connected to the wiring via 262 through the connection pad 105, the connection terminal 103 and the connection pad 263. That is, the first semiconductor chip 280 may be electrically connected to the connection pad 105, the connection terminal 103, the connection pad 263, the wiring via 262, the wiring 242 and the wiring via 264.

The first semiconductor chip 280 may be electrically connected to the pillar 300 through the connection pad 105, the connection terminal 103 and the connection pad 263. However, some example embodiments according to the technical idea of the inventive concepts are not limited thereto, and the first semiconductor chip 280 may be directly and electrically connected to the pillar 300, even without passing through the connection pad 105, the connection terminal 103 and the connection pad 263. Accordingly, the first semiconductor chip 280 may be electrically connected to the second semiconductor chip 120, the passive element 130 and the main board 30 through the pillar 300 and the wiring structure 112.

The first semiconductor chip 280 may include a plurality of signal terminals, a power terminal, a ground terminal and the like. Some of the plurality of signal terminals may be electrically connected to the antenna pattern 270 through the connection pad 105, the connection terminal 103, the connection pad 263, the wiring via 262, the wiring 242 and the wiring via 264. Some others of the plurality of signal terminals may be connected to some of the plurality of pillars 300. The power terminal may be connected to some of the plurality of pillars 300. The ground terminal may be connected to some of the plurality of pillars 300. For example, referring to FIGS. 5-6, the semiconductor package 100 may include multiple pillars 300 including a first pillar and a second pillar extending from the second face 200b of the second substrate 200 to the first substrate 110, and the first semiconductor chip 280 may include a first signal terminal, a second signal terminal, and a power terminal where, as shown in FIG. 5, the antenna pattern 270 is connected to the first signal terminal (e.g., through the connection pad 105, the connection terminal 103, the connection pad 263, the wiring via 262, the wiring 242 and the wiring via 264), a first pillar is connected to the power terminal, and a second pillar is connected to the second signal terminal. The first semiconductor chip 280 may connect (e.g., electrically connect) the first and second signal terminals to each other.

As further shown, one of the pillars 300 (e.g., a first pillar) may be connected to the second semiconductor chip 120 and the passive element 130 through the first substrate 110 (e.g., through the wiring structure 112), and another one of the pillars 300 (e.g., a second pillar) may be connected to one connection terminal 102 through the first substrate 110 (e.g., through the wiring structure 112).

As described herein, elements described to be connected to each other may be isolated from direct contact with each other and may be electrically coupled to each other through one or more conductive elements. For example, the antenna pattern 270 may be isolated from direct contact with the first semiconductor chip 280 and may be electrically connected to the first semiconductor chip 280 through the connection pad 105, the connection terminal 103, the connection pad 263, the wiring via 262, the wiring 242 and the wiring via 264.

The first semiconductor chip 280 may transmit and receive signals to and from the antenna pattern 270 through the connection pad 105, the connection terminal 103, the connection pad 263, the wiring via 262, the wiring 242 and the wiring via 264. The first semiconductor chip 280 may transmit and receive signals to and from the host 10 through the pillar 300. The first semiconductor chip 280 may be connected to the power supply voltage through the pillar 300. The first semiconductor chip 280 may be connected to the ground voltage through the pillar 300.

As a result, the routing for transmitting the signal from the first semiconductor chip 280 to the antenna pattern 270 may be separated from the routing for transmitting the signal from the first semiconductor chip 280 to the host 10. Therefore, the routing for transmitting the signal to the antenna pattern 270 may be simplified, and the semiconductor package 100 may be made thinner.

The first semiconductor chip 280 may be electrically connected to the ground pattern 222.

The antenna pattern 270 may be disposed on the second substrate 200 (e.g., on the second face 200b of the second substrate 200). The antenna pattern 270 may be disposed to be spaced apart from (e.g., isolated from direct contact with) the first semiconductor chip 280 (e.g., in the first direction X, second direction Y, and third direction Z as shown in at least FIGS. 4-5). The antenna pattern 270 may include a conductive material such as copper (Cu), aluminum (Al), silver (Ag), tin (Sn), gold (Au), nickel (Ni), lead (Pb), titanium (Ti), or alloys thereof.

Referring to FIG. 4, although a plurality of antenna patterns 270 may be provided, some example embodiments according to the technical concept of the inventive concepts are not limited thereto. The antenna pattern 270 may be disposed in a planar manner in the first direction X and the second direction Y.

Although the antenna pattern 270 may be a patch antenna, some example embodiments according to the inventive concepts are not limited thereto. For example, the antenna pattern 270 may be an array antenna, a folded dipole antenna, and a coplanar patch antenna. Also, the antenna pattern 270 may be a ring antenna, a loop antenna, or the like.

A length of the antenna pattern 270 in the first direction X or in the second direction Y is the second length L2, and a length of the first semiconductor chip 280 in the first direction X or in the second direction Y is the first length L1. Although the first length L1 may be larger than the second length L2, some example embodiments according to the technical idea of the inventive concepts are not limited thereto.

The antenna patterns 270 may be disposed to be insulated from each other by the third insulating layer 261.

Referring to FIG. 5 again, the antenna pattern 270 may be disposed on the third sub-substrate 260. However, some example embodiments according to the technical idea of the inventive concepts are not limited thereto, and the antenna pattern 270 may be surrounded by the third insulating layer 261. For example, the antenna pattern 270 may be formed such that the upper face of the antenna pattern 270 is exposed on the upper face of the third insulating layer 261, which may define the second face 200b of the second substrate 200.

The antenna pattern 270 may be formed to overlap (e.g., in the third direction Z) the wiring via 264. As a result, the antenna pattern 270 may be electrically connected to the wiring via 264. That is, the antenna pattern 270 is electrically connected to and may transmit and receive signals to and from the first semiconductor chip 280 through the connection pad 105, the connection terminal 103, the connection pad 263, the wiring via 262, the wiring 242 and the wiring via 264.

The antenna pattern 270 and the ground pattern 222 may radiate the signal transmitted from the first semiconductor chip 280. The antenna pattern 270 and the ground pattern 222 may receive the signals provided from the outside and transmit the signals to the first semiconductor chip 280.

As explained above, the distance at which the signal is transmitted from the first semiconductor chip 280 to the antenna pattern 270 may be shorter than the distance at which the signal is transmitted from the first semiconductor chip 280 to the second semiconductor chip 120, the passive element 130 and the first substrate 110. For example, the distance d between the first semiconductor chip 280 and the antenna pattern 270 may be smaller than the third length L3 which is the length of the pillar 300. As a result, the signal transmitted to the antenna pattern 270 may not be attenuated.

The antenna pattern 270 and the first semiconductor chip 280 may be disposed on the same surface. For example, although the antenna pattern 270 and the first semiconductor chip 280 may be disposed on the third sub-substrate 260, some example embodiments according to the technical idea of the inventive concepts are not limited thereto, and the antenna pattern 270 and the first semiconductor chip 280 may not be disposed on the same surface.

Since the first semiconductor chip 280 is disposed on the second substrate 200 or the third sub-substrate 260, heat generated from the first semiconductor chip 280 may be discharged into the air.

The second semiconductor chip 120 and the passive element 130 may be disposed in a space between the first substrate 110 and the second substrate 200. That is to say, the molded layer 150 for filling the space between the first substrate 110 and the second substrate 200 may cover the second semiconductor chip 120 and the passive element 130. As a result, the semiconductor elements except the first semiconductor chip 280 may be integrated in the space between the first substrate 110 and the second substrate 200.

Hereinafter, a semiconductor package 100 including an antenna pattern 272 according to some example embodiments will be described with reference to FIG. 8.

Figure 8:
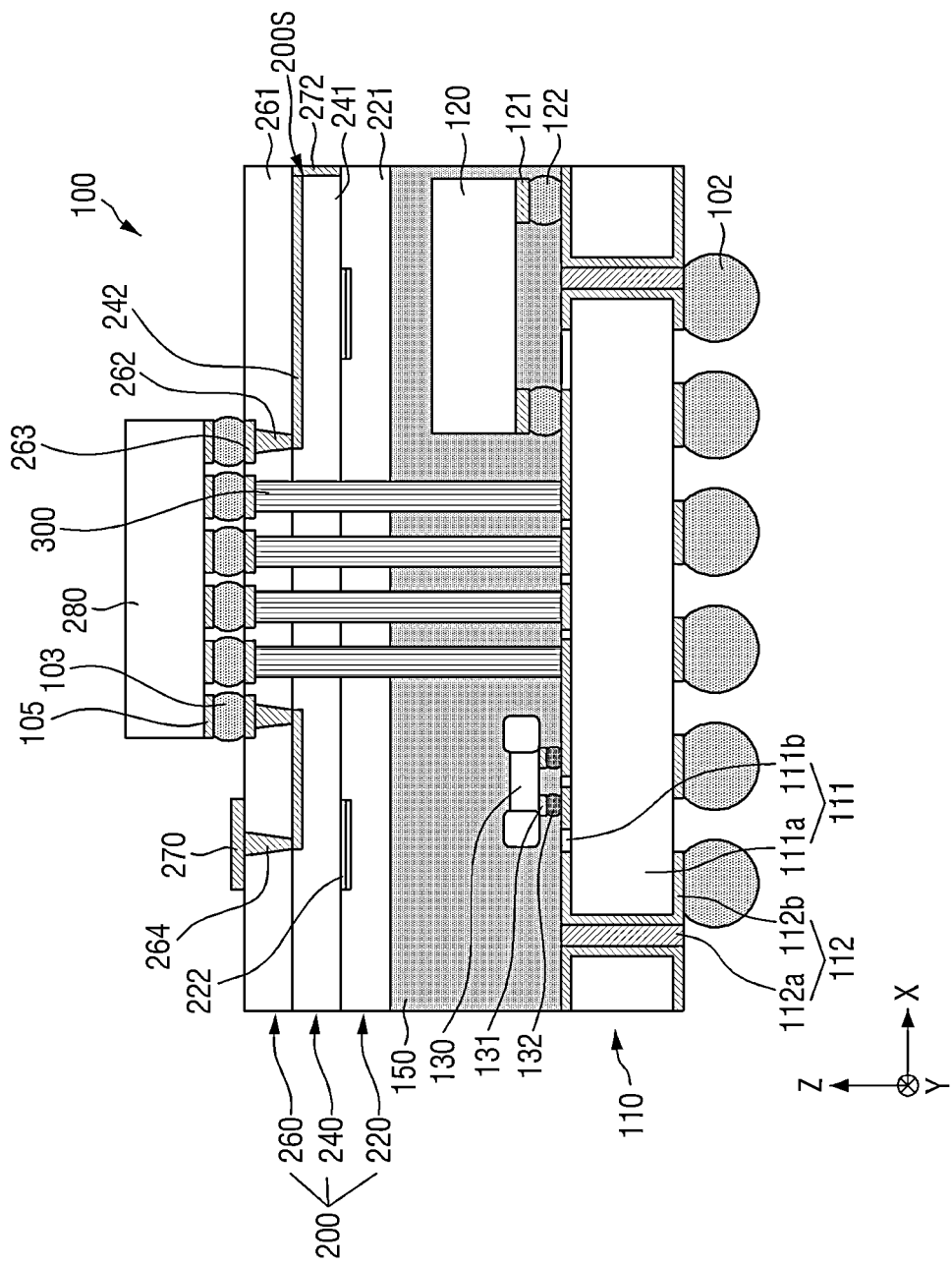
FIG. 8 is a cross-sectional view for explaining a semiconductor package according to some example embodiments of the inventive concepts.

FIG. 8 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 8, the semiconductor package 100 may include an antenna pattern 272. The antenna pattern 272 may be electrically connected to the connection pad 105, the connection terminal 103, the connection pad 263, the wiring via 262, the wiring 242 and the wiring via 264. The antenna pattern 272 may be disposed on the second sub-substrate 240.

The antenna pattern 272 may be at least partially disposed on (e.g., directly or indirectly on) the side walls 200s of the second substrate 200, where said side walls 200s may be at least partially defined by side walls of one or more of the first to third sub-substrates 220, 240, and 260. That is, as shown in FIG. 5, the antenna pattern 272 may be disposed on the side walls of the second sub-substrate 240 that at least partially define the side walls of the second substrate 200. The side faces of the antenna pattern 272 may be exposed to the side faces of the second substrate 200.

Although the antenna pattern 272 is shown as being disposed in the second sub-substrate 240 in the drawing, some example embodiments according to the technical idea of the inventive concepts are not limited thereto. For example, the antenna pattern 272 may be disposed to protrude from the second sub-substrate 240.

The antenna pattern 272 may be a dipole antenna or a Yagi antenna. The antenna pattern 270 radiates the signal in an inward direction of the semiconductor package 100, and meanwhile, the antenna pattern 272 may be disposed on the side walls of the second substrate 200 to radiate the signal in a lateral direction of the semiconductor package 100.

For example, beam forming may be used in the case of 5G communication.

Accordingly, the signal radiated from the antenna pattern 270 may not be transmitted in the lateral direction of the semiconductor package 100. Since the signal radiated from the antenna pattern 272 may be transmitted in the lateral direction of the semiconductor package 100, the signal may be radiated in various directions.

Hereinafter, a semiconductor package 100 including a wiring 265 according to some example embodiments will be described with reference to FIG. 9.

Figure 9:
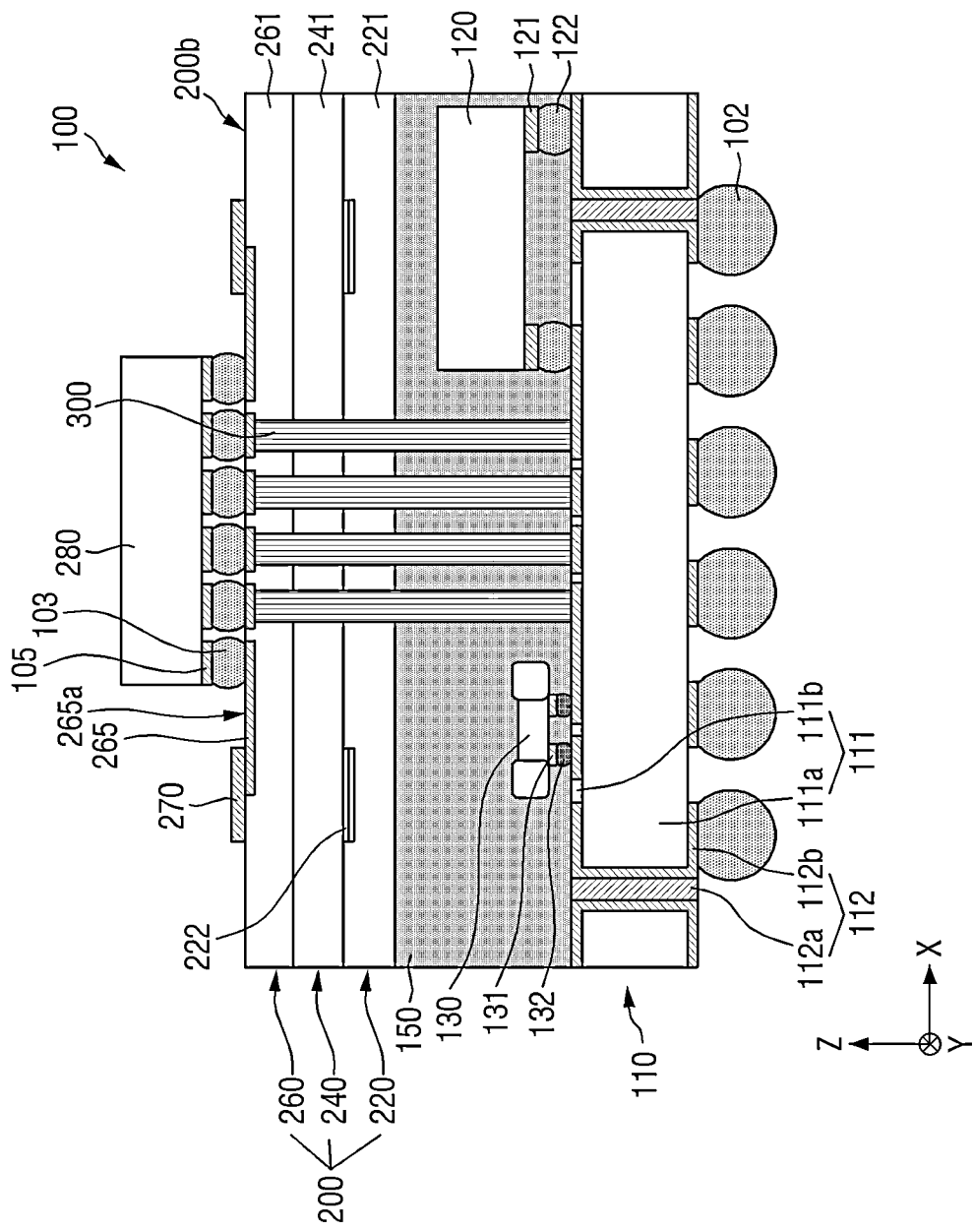
FIG. 9 is a cross-sectional view for explaining a semiconductor package according to some example embodiments of the inventive concepts.

FIG. 9 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 9, the semiconductor package 100 may include a wiring 265. The wiring 265 may be included in the third sub-substrate 260. The wiring 265 may be disposed on the third insulating layer 261. As shown in FIG. 9, an upper face 265a of the wiring 265 may be exposed on the upper face of the third insulating layer 261 and thus may be exposed on (and/or may at least partially define) the second face 200b of the second substrate 200. For example, although the wiring 265 may have a shape extending in the first direction X, some example embodiments according to the technical idea of the inventive concepts are not limited thereto.

The wiring 265 may electrically connect the first semiconductor chip 280 and the antenna pattern 270. The first semiconductor chip 280 and the antenna pattern 270 may partially overlap the wiring 265 (e.g., in the Third direction Z), such that at least a portion of the wiring 265 is not overlapped (e.g., is exposed by) the first semiconductor chip 280 and the antenna pattern 270 in the Third direction Z and/or at least a portion of the first semiconductor chip 280 and the antenna pattern 270 is not overlapped (e.g., is exposed by) the wiring 265 in the Third direction Z. The first semiconductor chip 280 and the antenna pattern 270 may transmit and receive signals through the wiring 265.

Since the wiring 265 is exposed on the upper face of the third insulating layer 261 and extends in the first direction X (for example, in the shape of a straight line), the distance between the first semiconductor chip 280 and the antenna pattern 270 may be minimized. For example, in FIG. 5, when the first semiconductor chip 280 and the antenna pattern 270 transmit and receive signals through the connection pad 263, the wiring via 262, the wiring 242 and the wiring via 264, the distance over which the signal is transmitted may be complicated. However, when the wiring 265 is exposed on the upper face of the third insulating layer 261, the distance between the first semiconductor chip 280 and the antenna pattern 270 is minimized, and the transmitted and received signal may not be attenuated.

Hereinafter, a semiconductor package 100 including first to third antenna patterns 267, 295 and 296 according to some example embodiments will be described with reference to FIG. 10.

Figure 10:
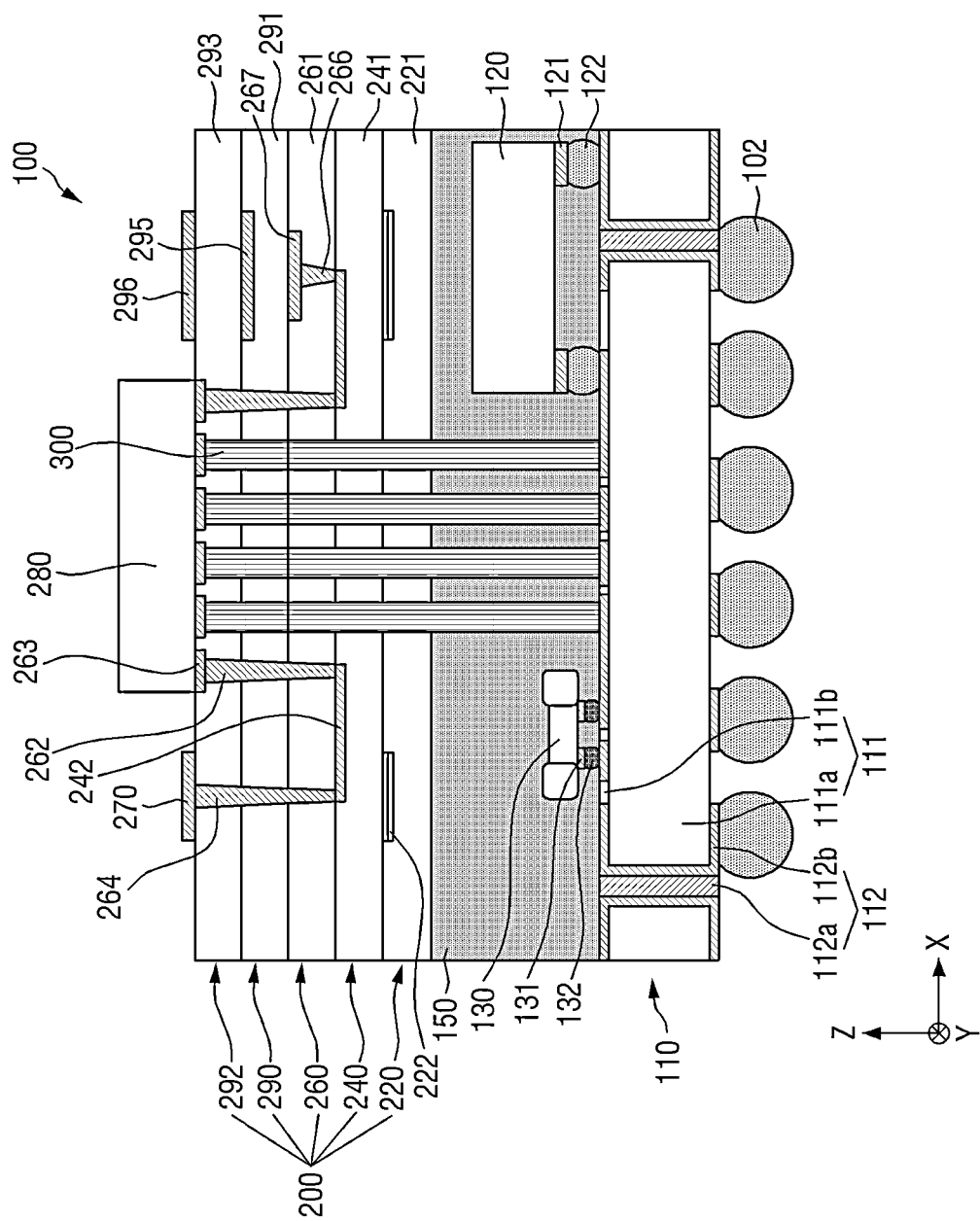
FIG. 10 is a cross-sectional view for explaining a semiconductor package according to some example embodiments of the inventive concepts.

FIG. 10 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 10, in the semiconductor package 100, the second substrate 200 may further include a fourth sub-substrate 290 and a fifth sub-substrate 292. In addition, the semiconductor package 100 may further include a third antenna pattern 296.

The fourth sub-substrate 290 may be disposed on the third sub-substrate 260. The fifth sub-substrate 292 may be disposed on the fourth sub-substrate 290.

The third sub-substrate 260 may include a wiring via 266 and a first antenna pattern 267. For example, the wiring via 266 may extend from the wiring 242 in the third direction Z to penetrate the third insulating layer 261. The first antenna pattern 267 may be electrically connected to the wiring via 266. The first antenna pattern 267 may be disposed on the upper face of the third insulating layer 261. The first antenna pattern 267 may include a conductive material such as copper (Cu), aluminum (Al), silver (Ag), tin (Sn), gold (Au), nickel (Ni), lead (Pb), titanium (Ti), or alloys thereof.

The fourth sub-substrate 290 may include a fourth insulating layer 291 and a second antenna pattern 295. The second antenna pattern 295 may be disposed to be exposed on the upper face of the fourth insulating layer 291. The second antenna pattern 295 may include a conductive material such as copper (Cu), aluminum (Al), silver (Ag), tin (Sn), gold (Au), nickel (Ni), lead (Pb), titanium (Ti), or alloys thereof.

The fifth sub-substrate 292 may include a fifth insulating layer 293 or the like.

The third antenna pattern 296 may be disposed on the fifth sub-substrate 292.

However, some example embodiments according to the technical idea of the inventive concepts are not limited thereto, and the third antenna pattern 296 may be disposed in the fifth insulating layer 293. The third antenna pattern 296 may include a conductive material such as copper (Cu), aluminum (Al), silver (Ag), tin (Sn), gold (Au), nickel (Ni), lead (Pb), titanium (Ti), or alloys thereof.

The signal provided from the first semiconductor chip 280 may be provided to the first antenna pattern 267 through the wiring 242 and the wiring via 266. The wiring 242 may be a feeding line.

The first antenna pattern 267 and the second antenna pattern 295 may be electronically coupled to each other. The second antenna pattern 295 and the third antenna pattern 296 may be electronically coupled to each other. Further, the first to third antenna patterns 267, 295 and 296 may be electronically coupled to radiate the signal.

Hereinafter, a semiconductor package 100 including an electromagnetic wave shielding film 350 according to some example embodiments will be described with reference to FIG. 11.

Figure 11:
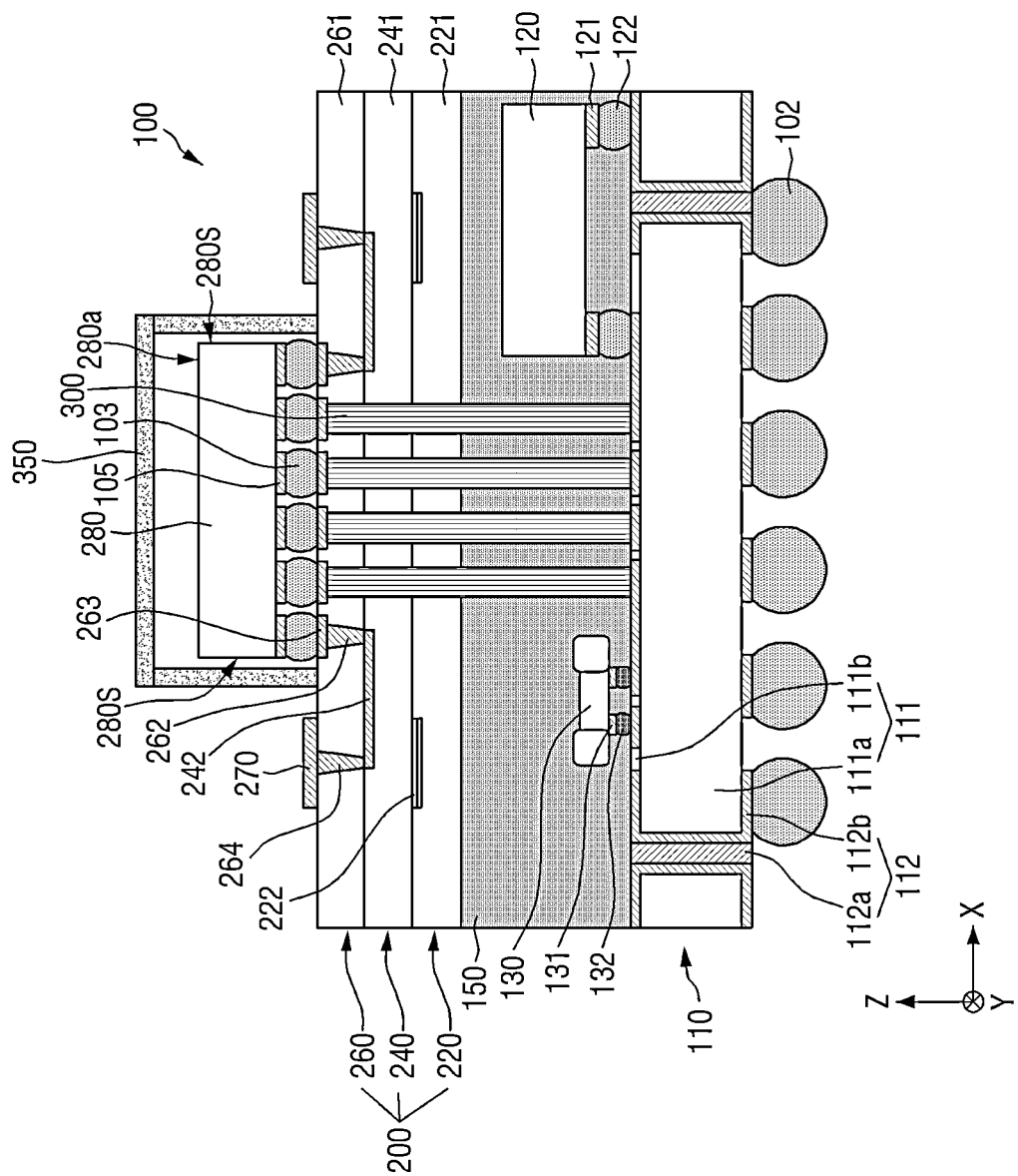
FIG. 11 is a cross-sectional view for explaining a semiconductor package according to some example embodiments of the inventive concepts.

FIG. 11 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 11, the semiconductor package 100 may include the electromagnetic wave shielding film 350. The electromagnetic wave shielding film 350 may be disposed on the upper face (e.g., second face 200*b*) of the second substrate 200. As shown in FIG. 11, the electromagnetic wave shielding film 350 may extend along (e.g., may overlap in the first to third directions X, Y, and Z, may obscure from exposure to an exterior of the semiconductor package 100, and/or may be indirectly or directly on) the side walls 280*s* and the upper face 280*a* of the first semiconductor chip 280. The electromagnetic wave shielding film 350 may surround the first semiconductor chip 280, while being disposed to be spaced apart from the first semiconductor chip 280.

The electromagnetic wave shielding film 350 may be in contact with the upper face of the third insulating layer 261. The electromagnetic wave shielding film 350 may be disposed not to be in contact with the first semiconductor chip 280 and the antenna pattern 270. For example, the side walls of the electromagnetic wave shielding film 350 may be disposed between the first semiconductor chip 280 and the antenna pattern 270.

The electromagnetic wave shielding film 350 may include a metallic material. The electromagnetic wave shielding film 350 may include, for example, at least one of silver (Ag), aluminum (Al), copper (Cu), platinum (Pt), zinc (Zn), nickel (Ni), iron (Fe) or alloys thereof.

The electromagnetic wave shielding film 350 is brought into contact with the ground region to ground and remove the electromagnetic waves from the outside of the semiconductor package 100, thereby blocking a hindrance due to electromagnetic waves (an electromagnetic interference). As a result, the electromagnetic wave shielding film 350 may prevent damage and malfunction of the semiconductor package 100 and ensure the operational reliability of the semiconductor package. Also, the electromagnetic wave shielding film 350 may also block electromagnetic waves radiated from the inside to the outside of the semiconductor package 100, thereby preventing malfunction of an adjacent semiconductor device or semiconductor package.

The electromagnetic wave shielding film 350 may remove the electromagnetic waves radiated from the antenna pattern 270 to block hindrance due to electromagnetic waves of the first semiconductor chip 280. The first semiconductor chip 280 does not receive the electromagnetic waves radiated from the antenna pattern 270, and the operational reliability of the first semiconductor chip 280 can be improved accordingly.

Hereinafter, a semiconductor package 100 including a heat slug 360 according to some example embodiments will be described with reference to FIG. 12.

Figure 12:
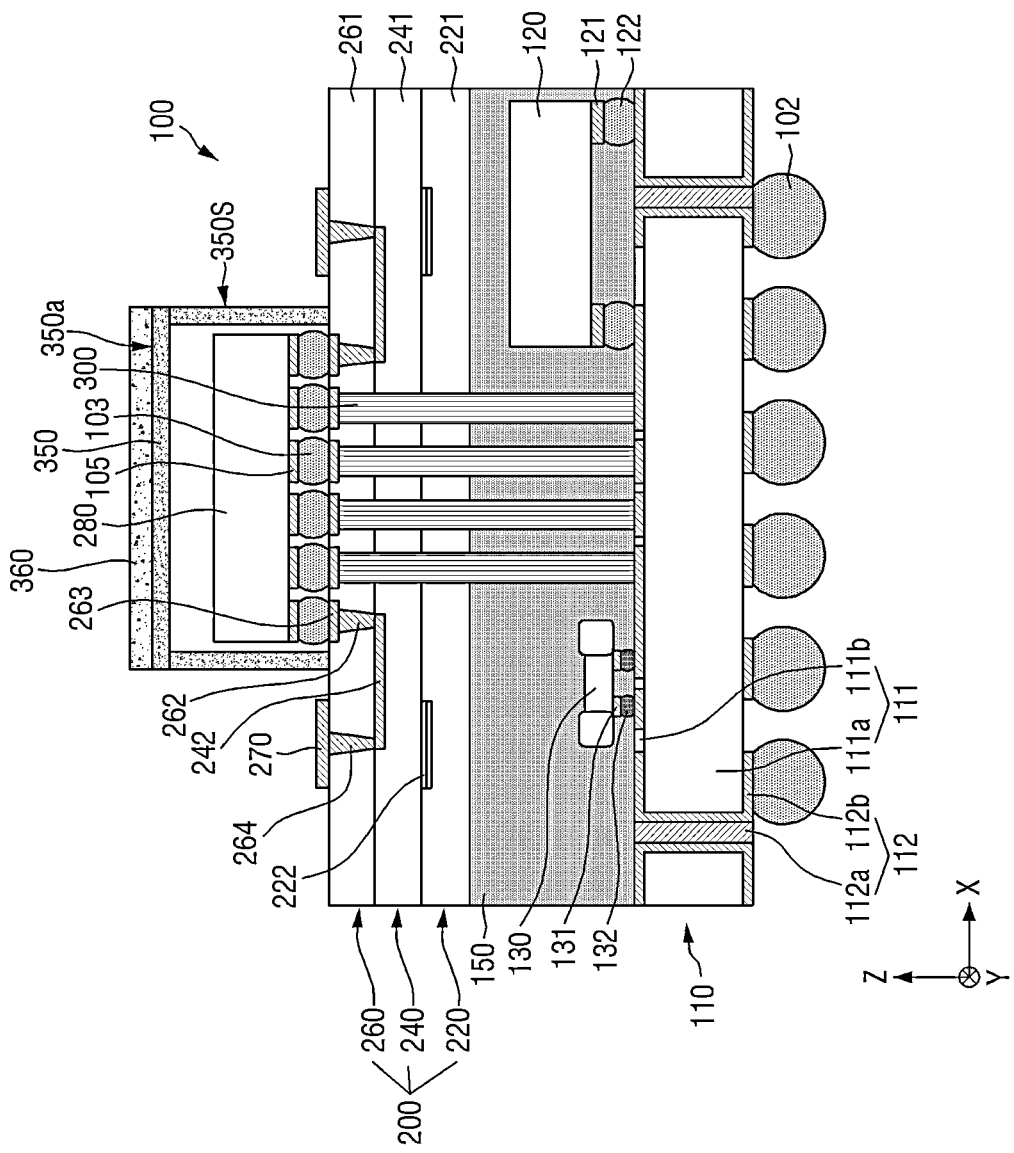
FIG. 12 is a cross-sectional view for explaining a semiconductor package according to some example embodiments of the inventive concepts.

FIG. 12 is a cross-sectional view for explaining a semiconductor package according to some example embodiments of the inventive concepts. For the sake of convenience of explanation, repeated parts of contents explained using FIGS. 1 to 7 and 11 will be briefly explained or omitted.

Referring to FIG. 12, the semiconductor package 100 may further include the heat slug 360. The heat slug 360 may be disposed on (e.g., directly or indirectly on) the upper face 350*a* of the electromagnetic wave shielding film 350. As shown in FIG. 12, the heat slug 360 may extend along (e.g., may partially or completely overlap in the third direction Z and/or may be directly or indirectly on) the upper face 350*a* of the electromagnetic wave shielding film 350. However, some example embodiments according to the technical idea of the inventive concepts are not limited thereto, and the heat slug 360 may be disposed along the side faces 350*s* and the upper face 350*a* of the electromagnetic wave shielding film 350.

The heat slug 360 may include metal, which is a material having a higher thermal conductivity than air. For example, the heat slug 360 may include copper (Cu), iron (Fe), nickel (Ni), cobalt (Co), tungsten (W), chromium (Cr), silver (Ag), gold (Au), platinum (Pt), tin (Sn), aluminum (Al), magnesium (Mg), silicon (Si), zinc (Zn), or a combination thereof.

Although not shown, a thermal interface material (TIM) may be disposed between the heat slug 360, the electromagnetic wave shielding film 350 and the first semiconductor chip 280. The thermal interface material may be, for example, but is not limited to, at least one a metal material selected from silver (Ag), aluminum (Al), copper (Cu), platinum (Pt), zinc (Zn), nickel (Ni), and iron (Fe), or alloys of the metal materials.

The heat slug 360 is disposed above the first semiconductor chip 280 and the electromagnetic wave shielding film 350 and may discharge heat generated from the first semiconductor chip 280. Since the first semiconductor chip 280 is disposed on the upper face of the semiconductor package 100, the heat generated from the first semiconductor chip 280 may be more effectively discharged through the heat slug 360.

Hereinafter, a semiconductor package 100 including a molded layer 152 according to some example embodiments will be described with reference to FIGS. 13 and 14.

Figure 13:
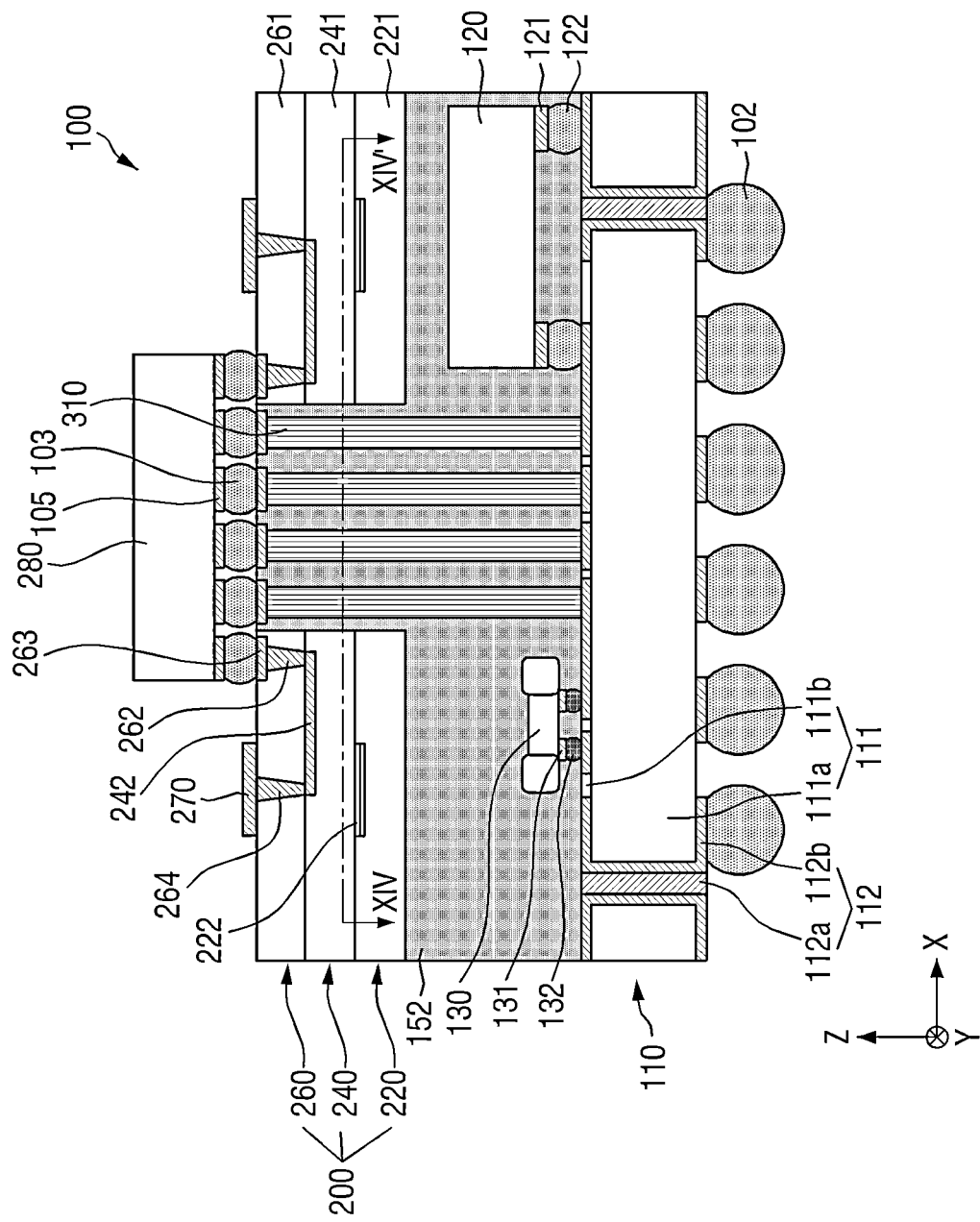
FIG. 13 is a cross-sectional view for explaining a semiconductor package according to some example embodiments of the inventive concepts.

FIG. 13 is a cross-sectional view for explaining a semiconductor package according to some example embodiments of the inventive concepts. FIG. 14 is a cross-sectional view for explaining the semiconductor package taken along a line XIV-XIV' of FIG. 13. For the sake of convenience of explanation, repeated parts of contents explained using FIGS. 1 to 7 will be briefly explained or omitted.

Referring to FIG. 13, the semiconductor package 100 may include the molded layer 152.

Figure 14:
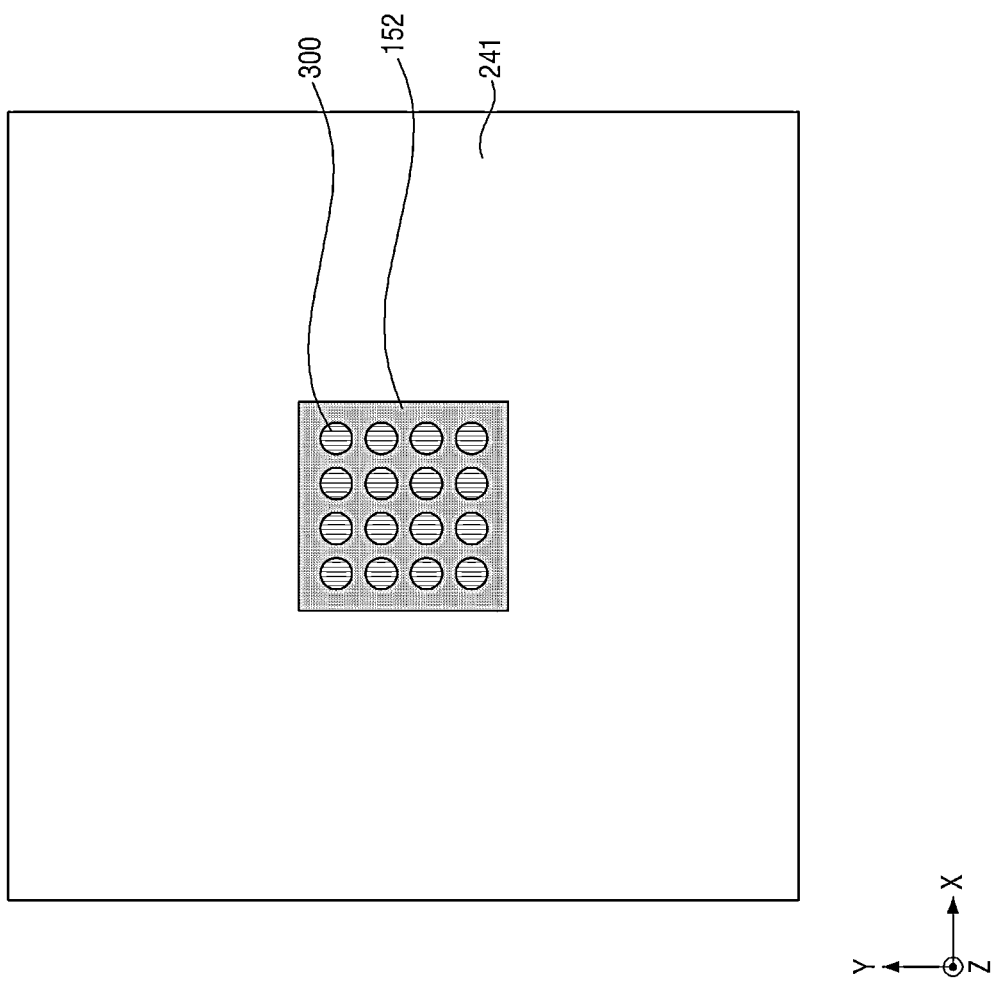
FIG. 14 is a cross-sectional view for explaining the semiconductor package taken along a line XIV-XIV' of FIG. 13.

Referring to FIG. 14, the second substrate 200 may include a hole penetrating a central part. For example, the first to third sub-substrates 220, 240 and 260 may include holes penetrating the central parts of each substrate. A pillar 310 may be disposed in the hole of the second substrate 200.

Referring to FIG. 13 again, the molded layer 152 may fill between the first substrate 110 and the second substrate 200 and fill the holes of the second substrate 200. The molded layer 152 may be formed to surround the pillar 310. The molded layer 152 may be disposed below the first semiconductor chip 280.

The molded layer 152 may include epoxy molding compound (EMC), or two or more kinds of silicon hybrid materials.

The molded layer 152 may protect the pillar 310 from the external environment, by surrounding the pillar 310 extending from the first semiconductor chip 280 to the first substrate 110.

Hereinafter, a semiconductor package 100 including a coreless substrate 113 according to some example embodiments will be described with reference to FIG. 15.

Figure 15:
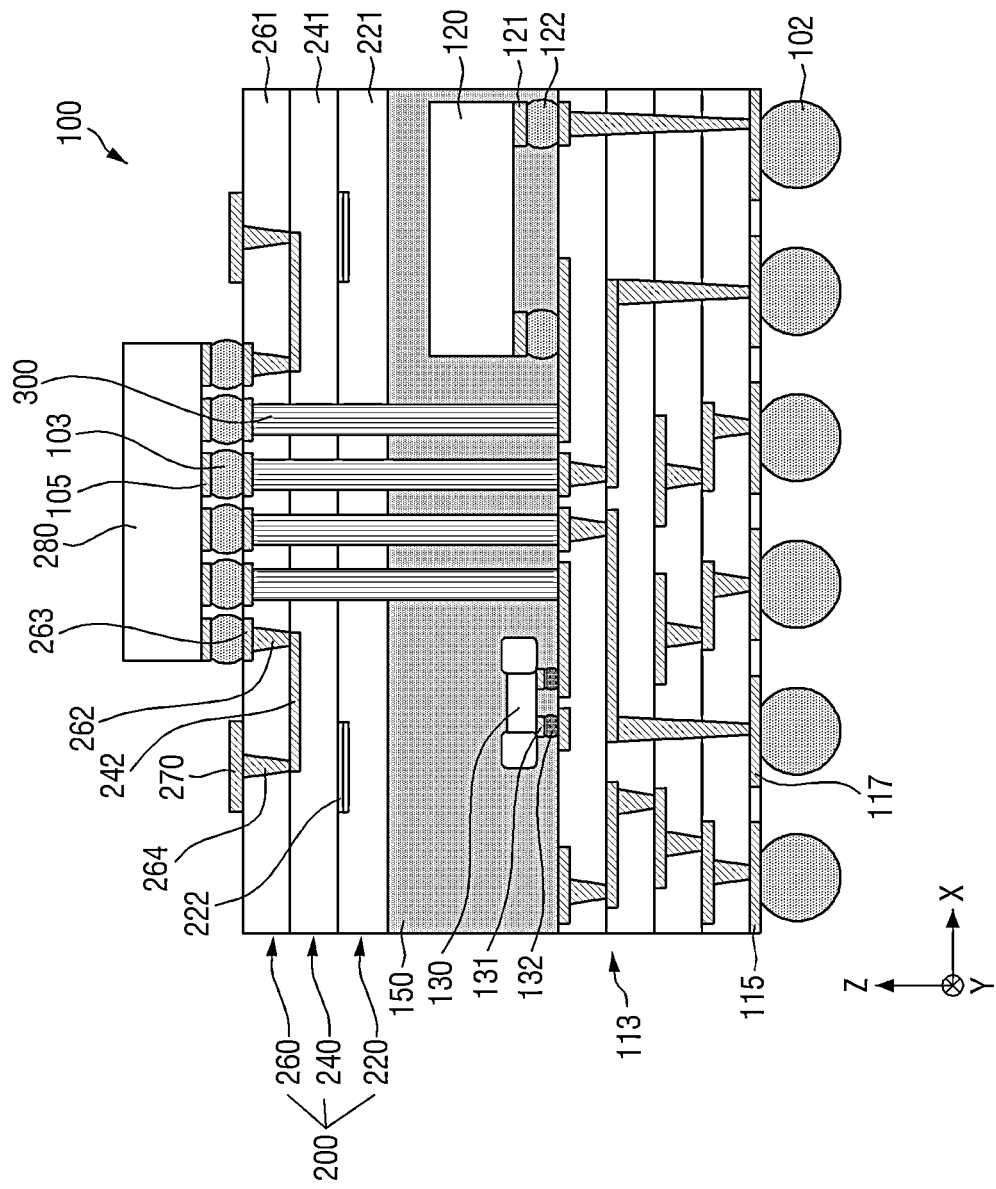
FIG. 15 is a cross-sectional view for explaining a semiconductor package according to some example embodiments of the inventive concepts.

FIG. 15 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 15, the semiconductor package 100 may include a coreless substrate 113. That is, the semiconductor package 100 may include the coreless substrate 113 instead of the first substrate 110 of FIG. 5.

The coreless substrate 113 may be disposed below the molded layer 150 and the second substrate 200. Ae wiring structure of the coreless substrate 113 may be connected to the second semiconductor chip 120 and the passive element 130. The wiring structure of the coreless substrate 113 may be electrically connected to the first semiconductor chip 280 through the pillar 300.

The coreless substrate 113 may be disposed above the passivation layer 115. The passivation layer 115 may include a connection pad 117. The wiring structure of the coreless substrate 113 may be electrically connected to the connection terminal 102 through the connection pad 117. The coreless substrate 113 may be electrically connected to the main board 30 through the connection pad 117 and the connection terminal 102.

The coreless substrate 113 may not include the core 111, unlike the first substrate 110 of FIG. 5. Accordingly, the thickness of the coreless substrate 113 may be smaller than the thickness of the first substrate 110.

Hereinafter, a semiconductor package 100 including a redistribution layer 114 according to some example embodiments will be described with reference to FIG. 16.

Figure 16:
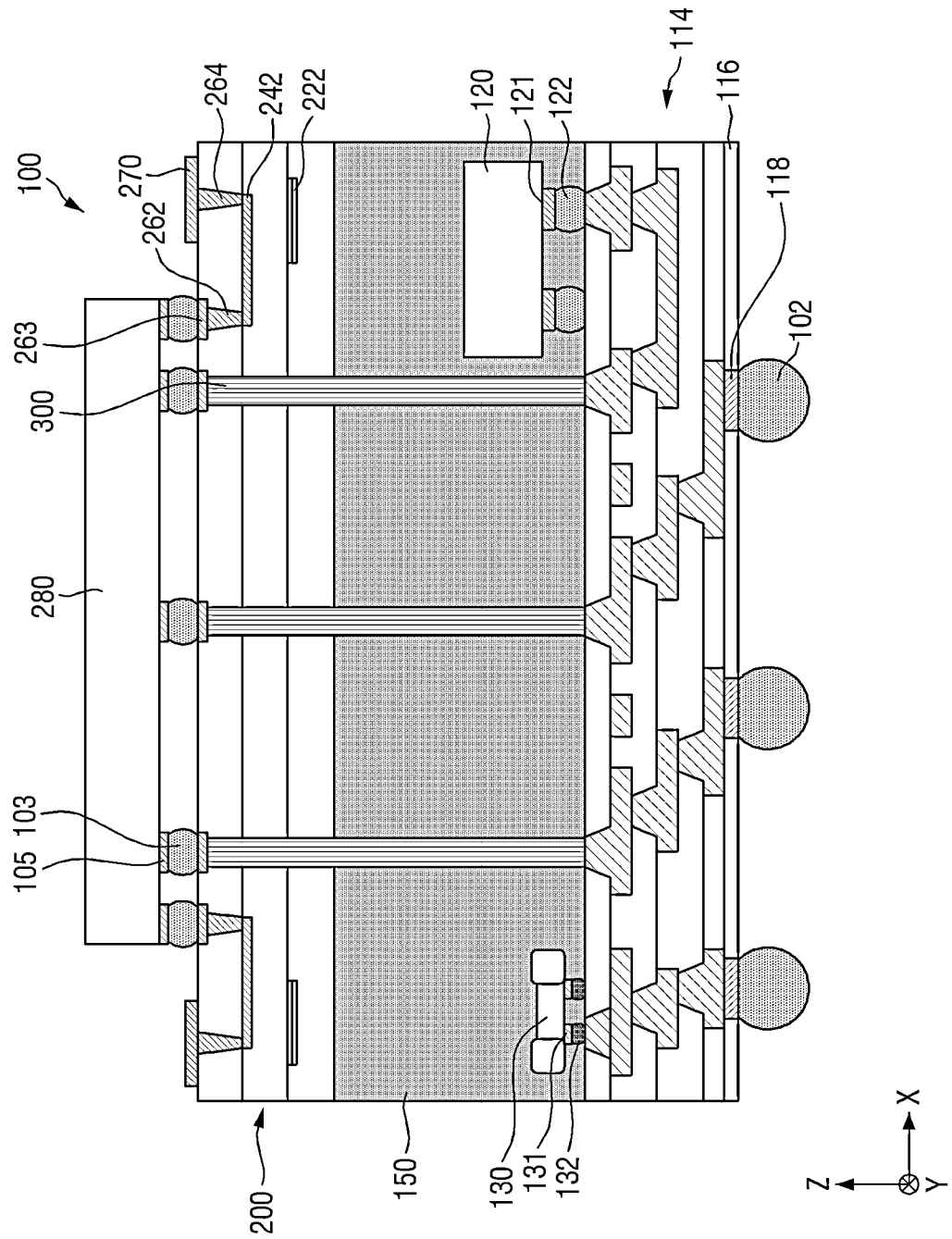
FIG. 16 is a cross-sectional view for explaining a semiconductor package according to some example embodiments of the inventive concepts.

FIG. 16 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 16, the semiconductor package 100 may include a redistribution line (RDL) that is a redistribution layer 114. That is, the semiconductor package 100 may include the redistribution layer 114, instead of the first substrate 110 of FIG. 5.

The redistribution layer 114 may be disposed below the molded layer 150 and the second substrate 200. The redistribution pattern and the via of the redistribution layer 114 may be connected to the second semiconductor chip 120 and the passive element 130. The redistribution pattern and the via of the redistribution layer 114 may be electrically connected to the first semiconductor chip 280 through the pillar 300.

The redistribution layer 114 may be disposed above the passivation layer 116. The passivation layer 116 may include a connection pad 118. The redistribution pattern and the via of the redistribution layer 114 may be electrically connected to the connection terminal 102 through the connection pad 118. The redistribution layer 114 may be electrically connected to the main board 30 through the connection pad 118 and the connection terminal 102.

Further, although a FOWLP (Fan-Out Wafer Level Package) type semiconductor package is shown in the drawing, the technical idea of the inventive concepts is not limited thereto. For example, the semiconductor package 100 according to some example embodiments may be a semiconductor package of another form in which a bottom face thereof is formed by a redistribution structure, like a FIWLP (Fan-In Wafer Level Package) type semiconductor package and a FOPLP (Fan-Out Panel Level Package) type semiconductor package.

Hereinafter, a semiconductor package 100 including a molded layer 152 according to some example embodiments will be described with reference to FIGS. 17 and 18.

Figure 17:
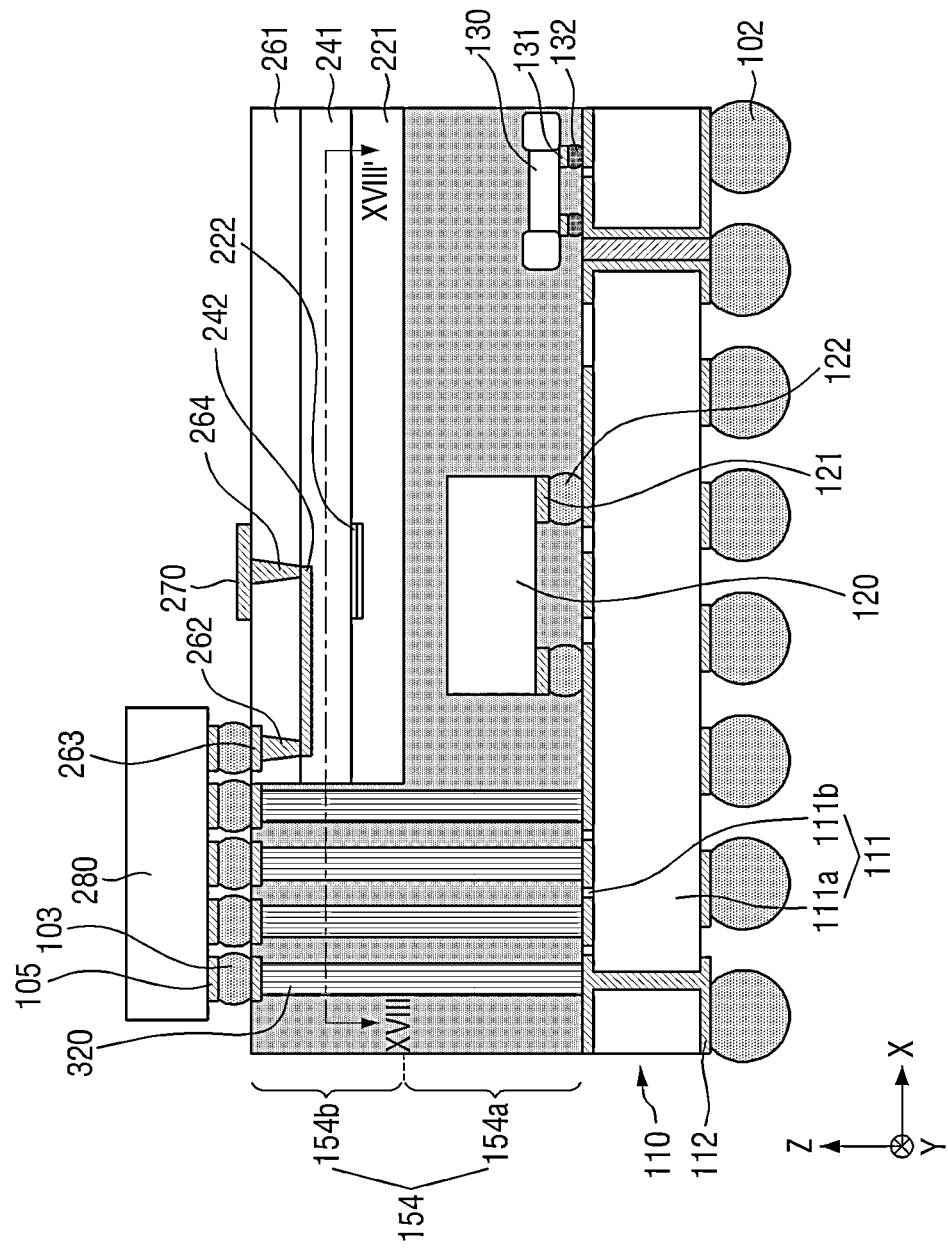
FIG. 17 is a cross-sectional view for explaining a semiconductor package according to some example embodiments of the inventive concepts.

FIG. 17 is a cross-sectional view for explaining a semiconductor package according to some example embodiments of the inventive concepts. FIG. 18 is a cross-sectional view for explaining the semiconductor package taken along a line XVIII-XVIII' of FIG. 17. For the sake of convenience of explanation, repeated parts of contents explained using FIGS. 1 to 7 will be briefly explained or omitted.

While FIG. 17 shows a single molded layer 154, in some example embodiments a semiconductor package 100 may include two separate molded layers that collectively define the molded layer 154, for example including a first molded layer 154a between (e.g., directly between in the third direction Z) the first substrate 110 and the second substrate and a second molded layer 154b between (e.g., directly between in the third direction Z) the first molded layer 154a and the first semiconductor chip 280. As shown in FIG. 17, a pillar 320 may penetrate the first and second molded layers 154a and 154b and extend to the first substrate 110.

Figure 18:
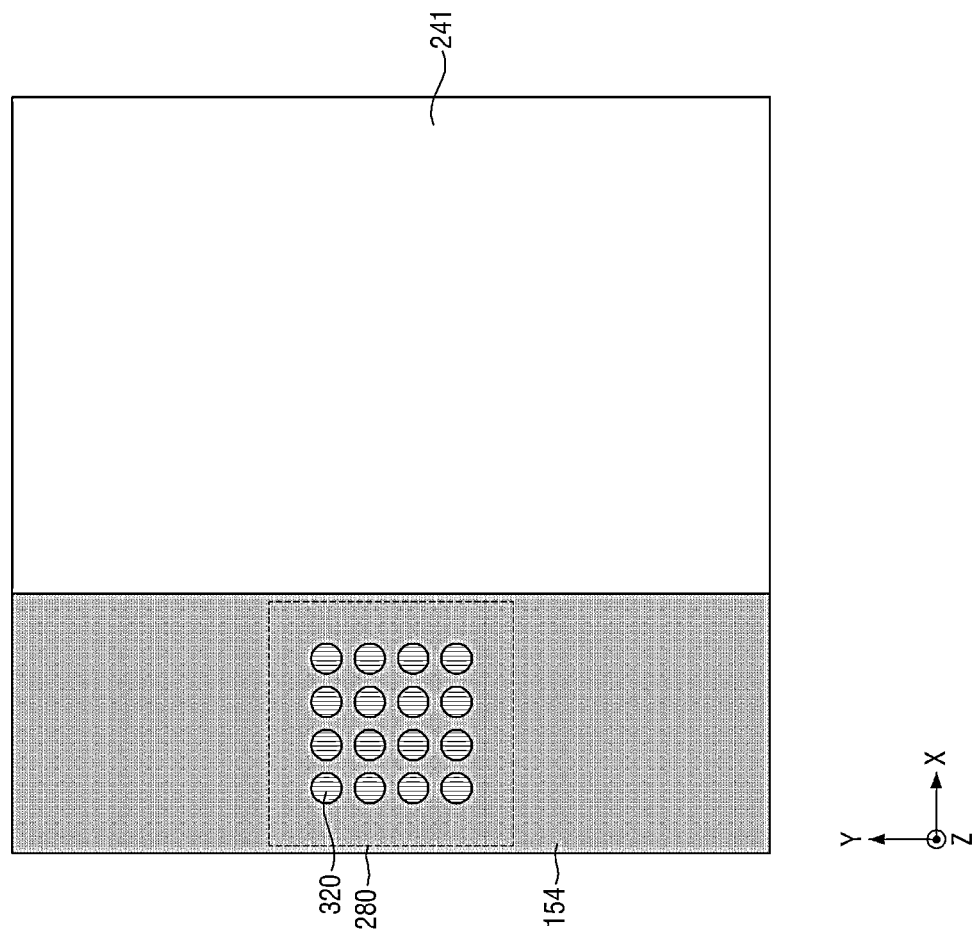
FIG. 18 is a cross-sectional view for explaining the semiconductor package taken along a line XVIII-XVIII' of FIG. 17.

Referring to FIGS. 17 and 18, the molded layer 154 may be disposed on the first substrate 110. A height of a first side wall of the molded layer 154 may be greater than a height of a second side wall. For example, the second substrate 200 may be disposed on the second side wall of the molded layer 154. That is, the second substrate 200 may be disposed on a step formed in the molded layer 154. The first to third sub-substrates 220, 240 and 260 may be disposed on the step formed in the molded layer 154.

The molded layer 154 may surround the pillar 320. That is, the pillar 320 may penetrate the molded layer 154 and be connected to the first substrate 110. The pillar 320 may be disposed on an upper face of an edge part of the first substrate 110, and the pillar 320 may be formed to penetrate the edge part of the molded layer 154.

The first semiconductor chip 280 may be disposed on the molded layer 154 and the second substrate 200. That is, the first semiconductor chip 280 may be disposed on the upper face of the portion in which the molded layer 154 is exposed on the upper face of the semiconductor package 100. The first semiconductor chip 280 may be connected to the first substrate 110 through the pillar 320. The first semiconductor chip 280 may be connected to the antenna pattern 270 through the wiring 242.

Only the molded layer 154 may be etched to insert a pillar 320 for connecting between the first substrate 110 and the first semiconductor chip 280. That is, the second substrate 200 may not need to be etched for inserting the pillar 320.

Hereinafter, a semiconductor package 100 including an electromagnetic wave shielding film 350 and a heat slug 360 according to some example embodiments will be described with reference to FIG. 19.

Figure 19:
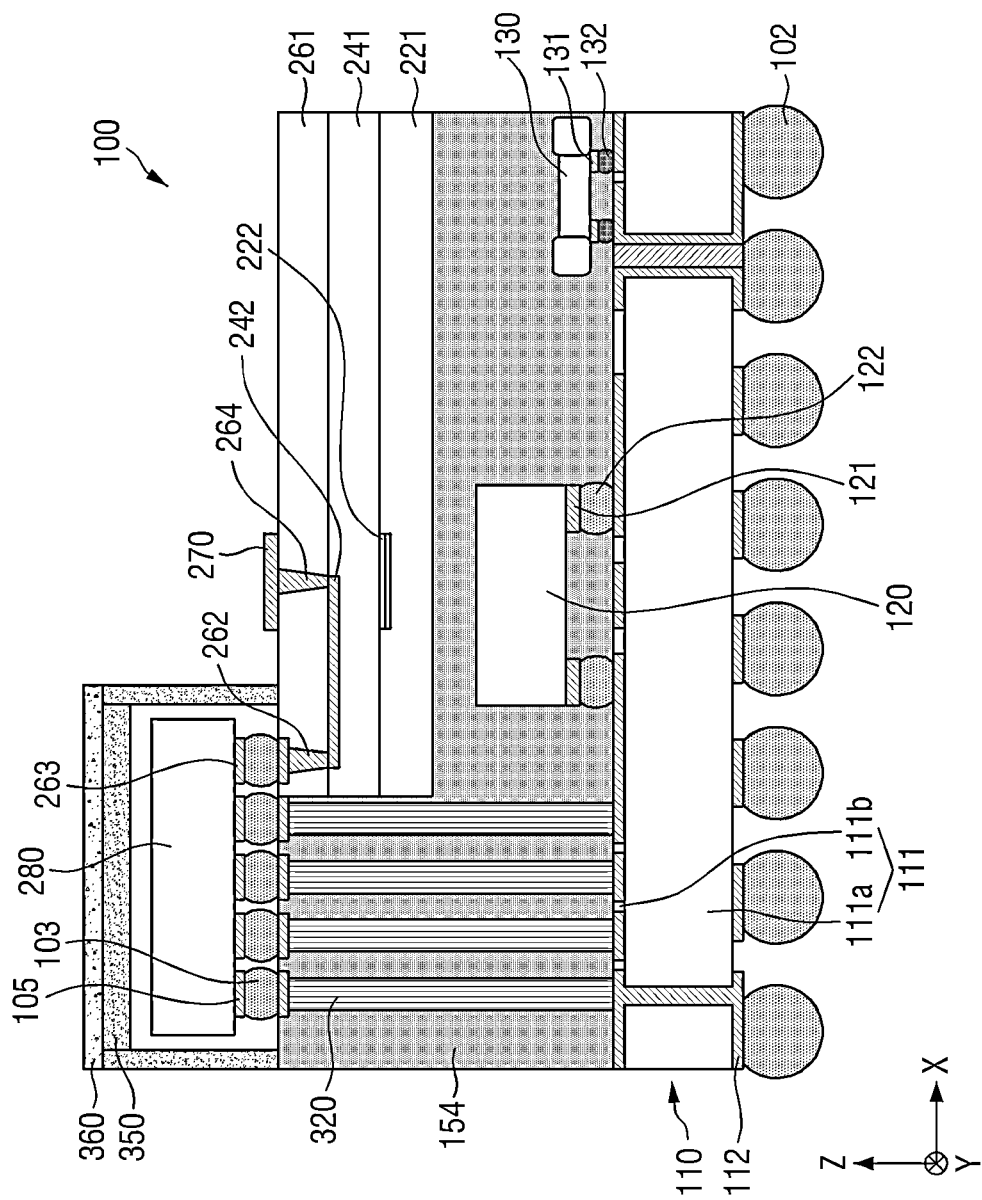
FIG. 19 is a cross-sectional view for explaining a semiconductor package according to some example embodiments of the inventive concepts.

FIG. 19 is a cross-sectional view for explaining a semiconductor package according to some example embodiments of the inventive concepts. For the sake of convenience of explanation, repeated parts of contents explained using FIGS. 1 to 7, 17 and 18 will be briefly explained or omitted.

Referring to FIG. 19, the electromagnetic wave shielding film 350 and the heat slug 360 may be disposed on the second substrate 200 and the molded layer 154. The electromagnetic wave shielding film 350 may be formed along the side walls and the upper face of the first semiconductor chip 280. The heat slug 360 may be formed along the upper face of the electromagnetic wave shielding film 350.

The electromagnetic wave shielding film 350 is disposed to wrap the first semiconductor chip 280 at the edge part of the second substrate 200 and may block the signal radiated from the antenna pattern 270. The heat slug 360 is disposed on the first semiconductor chip 280 at the edge part of the second substrate 200 and may discharge the heat generated from the first semiconductor chip 280 into the air.

A semiconductor package 100 including a molded layer 156, a pillar 330, and an antenna pattern 274 according to some example embodiments will be described below with reference to FIG. 20.

Figure 20:
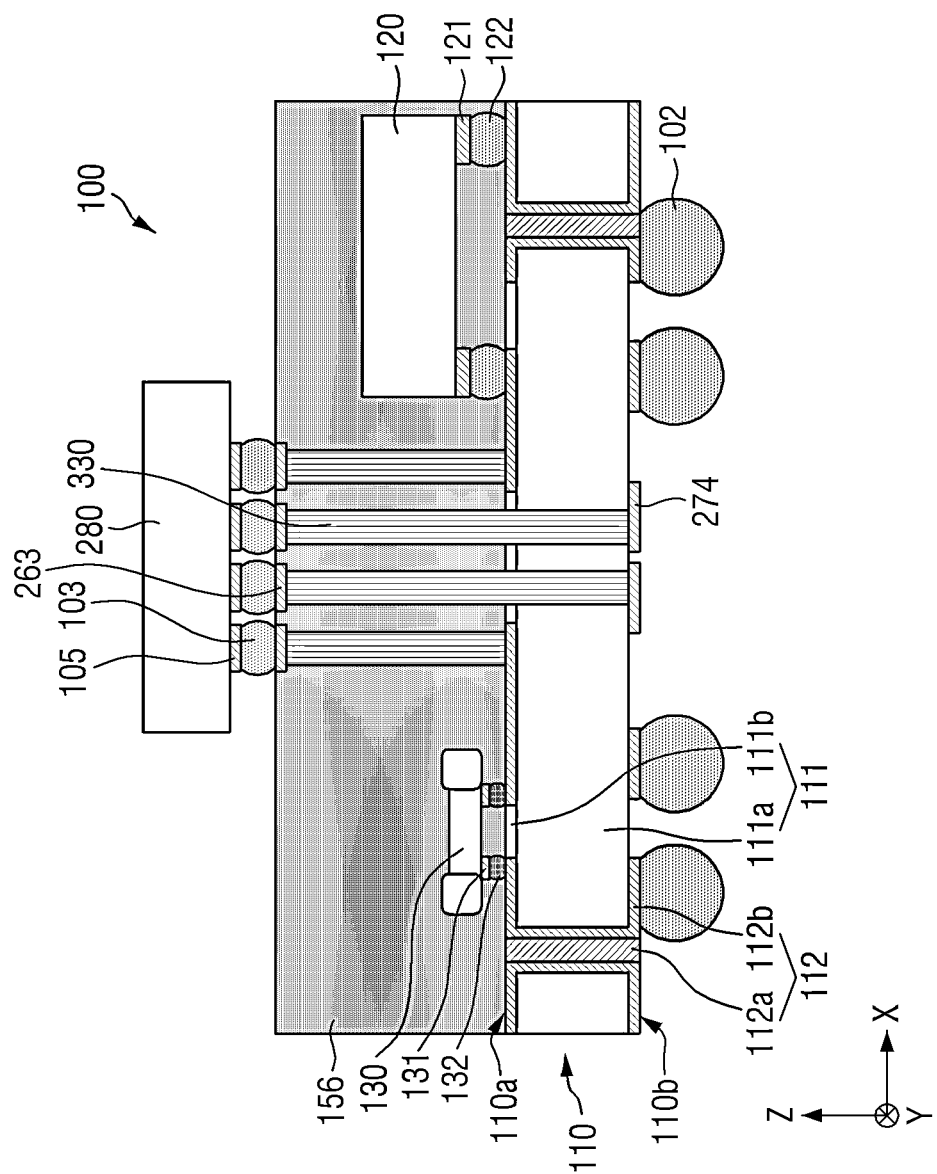
FIG. 20 is a cross-sectional view for explaining a semiconductor package according to some example embodiments of the inventive concepts.

FIG. 20 is a cross-sectional view for explaining a semiconductor package according to some example embodiments of the inventive concepts. For the sake of convenience of explanation, repeated parts of contents explained using FIGS. 1 to 7 will be briefly explained or omitted.

Referring to FIG. 20, the molded layer 156 may be disposed on the first substrate 110 (e.g., on the third face 110a). For example, the molded layer 156 may be formed to cover the first substrate 110, the second semiconductor chip 120 and the passive element 130. The molded layer 156 may include a glass material that may reduce the attenuation of the signal transmitted through the pillar 330.

The pillar 330 may be formed to penetrate the molded layer 156 and may further penetrate the first substrate 110. The pillar 330 may extend from the upper face of the molded layer 156 to the upper face (e.g., third face 110a) and/or to the lower face (e.g., fourth face 110b) of the first substrate 110. The pillar 330 may be connected to the wiring structure 112.

The pillar 330 may be formed to penetrate the molded layer 156 and the first substrate 110. The pillar 330 may extend from the upper face of the molded layer 156 to the lower face (e.g., fourth face 110b) of the first substrate 110. The pillar 330 may penetrate the core 111 of the first substrate 110.

The first semiconductor chip 280 may be disposed on the molded layer 156 and the pillar 330 and may be connected to the pillar 330. For example, the first semiconductor chip 280 may be disposed on the upper face of the molded layer 156. The first semiconductor chip 280 may be electrically connected to the pillar 330. For example, the first semiconductor chip 280 may be electrically connected to the wiring structure 112 through the pillar 330.

The antenna pattern 274 may be disposed on the lower face (e.g., fourth face 110b) of the first substrate 110. The antenna pattern 274 may be connected (e.g., electrically connected) to the pillar 330 penetrating the first substrate 110. For example, the antenna pattern 274 may be electrically connected to the first semiconductor chip 280 through the pillar 330. The antenna pattern 274 may receive the signal from the first semiconductor chip 280 and radiate the signal into the air.

In some example embodiments, the first substrate 110 may be connected to a main board 30, for example as shown in FIG. 3, and the antenna pattern 274 may be disposed between the first substrate 110 and the main board 30 (e.g., in the third direction Z). For example, the antenna pattern 274 may be disposed in the space between the lower face of the first substrate 110 and the upper face of the main board 30.

A semiconductor package 100 including an antenna substrate 400 according to some example embodiments will be described below with reference to FIGS. 21 and 22.

Figure 21:
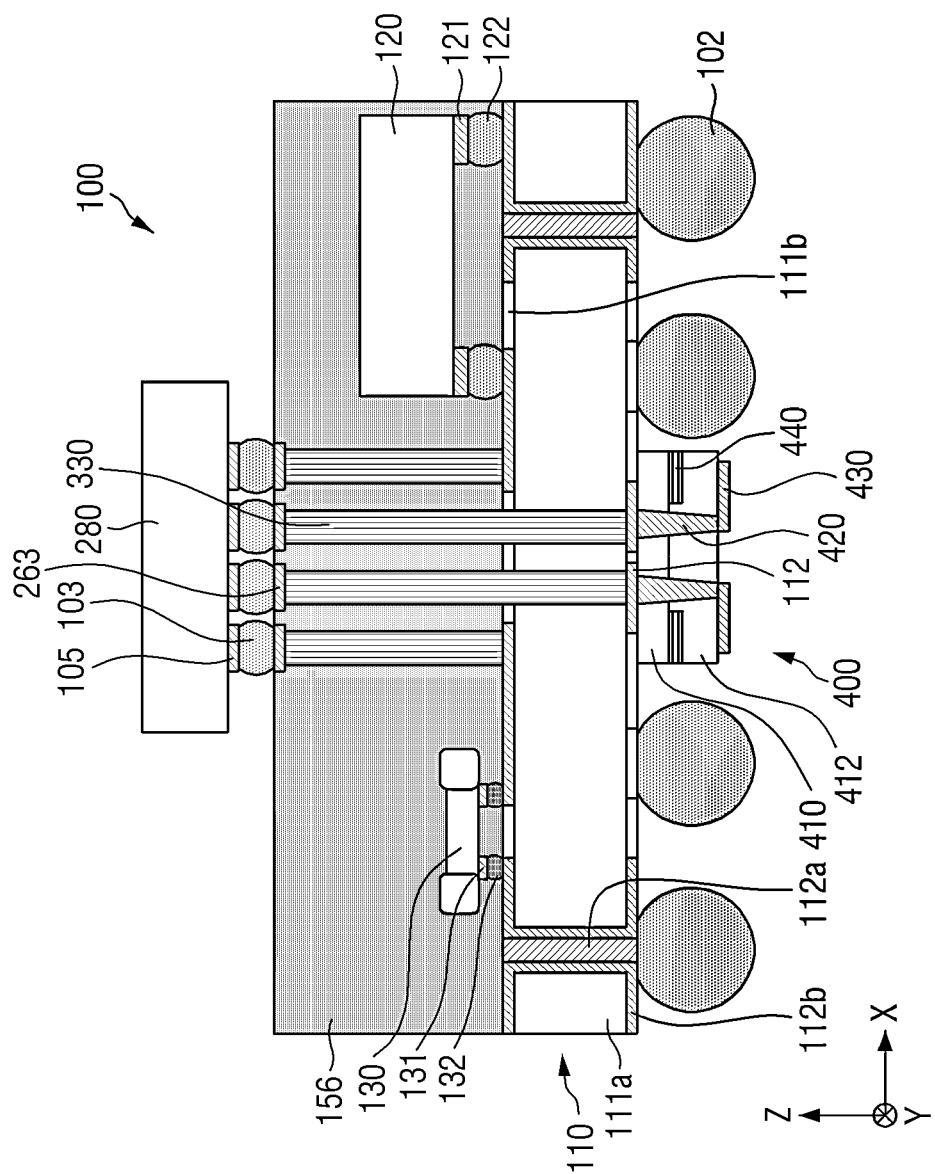
FIG. 21 is a cross-sectional view for explaining a semiconductor package according to some example embodiments of the inventive concepts.

FIG. 21 is a cross-sectional view for explaining a semiconductor package according to some example embodiments of the inventive concepts. FIG. 22 is a diagram of the semiconductor package of FIG. 21 as seen from below. For the sake of convenience of explanation, the repeated parts of contents explained using FIGS. 1 to 7 and 20 will be briefly explained or omitted.

Referring to FIG. 21, the semiconductor package 100 may further include an antenna substrate 400. The antenna substrate 400 may include a first antenna substrate 410, a second antenna substrate 412, an antenna pattern 430 and a wiring via 420.

The antenna substrate 400 may be disposed below the first substrate 110 and may be between said lower face of the first substrate 110 and the antenna pattern 430. The antenna substrate 400 may include a first antenna substrate 410 and a second antenna substrate 412. The first antenna substrate 410 may be attached to the lower face (e.g., fourth face 110b) of the first substrate 110. The second antenna substrate 412 may be attached to the lower face of the first antenna substrate 410. The second antenna substrate 412 may include a ground pattern 440 inside.

The wiring via 420 may penetrate the first and second antenna substrates 410 and 412. Accordingly, it will be understood that the wiring via 420 and the ground pattern 440 may be in the antenna substrate 400 (e.g., encompassed within a volume space defined by outer surfaces of the antenna substrate 400). The wiring via 420 may be electrically connected to the first semiconductor chip 280 through the wiring structure 112 and the pillar 330. Accordingly, the antenna pattern 430 and the pillar 330 may be connected to each other by at least the wiring via 420.

Referring to FIG. 22, the antenna pattern 430 may be disposed on the lower face of the second antenna substrate 412. For example, a plurality of antenna patterns 430 may be attached to the lower face of the second antenna substrate 412. A length of the antenna pattern 430 in the first direction X or the second direction Y may be a fourth length L4. The fourth length L4 is smaller than a first length L1 which is a length of the first semiconductor chip 280 in the first direction X or the second direction Y. Accordingly, a plurality of antenna patterns 430 that radiate 5G signals may be disposed on the lower face of the semiconductor package 100.

In concluding the detailed description, those skilled in the art will appreciate that many variations and modifications may be made to some example embodiments without substantially departing from the principles of the inventive concepts. Therefore, some example embodiments of the inventive concepts are used in a generic and descriptive sense only and not for purposes of limitation.

What is claimed is:
1. A semiconductor package, comprising:
a first substrate;
a second substrate on the first substrate, the second substrate including a first face facing the first substrate and a second face opposite to the first face;

a pillar extending from the second face of the second substrate to the first substrate; and a first semiconductor chip on the second face of the second substrate and connected to the pillar, wherein the second substrate includes an antenna pattern, wherein the antenna pattern is connected to the first semiconductor chip, and the antenna pattern is on the second face of the second substrate such that the antenna pattern is isolated from direct contact with the first semiconductor chip, wherein the second substrate is between the antenna pattern and the first substrate, and the second substrate is between the first semiconductor chip and the first substrate.

2. The semiconductor package of claim 1, wherein the first semiconductor chip includes an RFIC (radio frequency integrated circuit) chip.

3. The semiconductor package of claim 1, wherein
the first substrate includes
a third face facing the second substrate, and
a fourth face opposite to the third face, and
the pillar is connected to the third face of the first substrate.

4. The semiconductor package of claim 3, wherein
the first substrate includes a wiring structure,
a part of the wiring structure is exposed on the third face of the first substrate, and
the wiring structure is connected to the pillar.

5. The semiconductor package of claim 1, further comprising:
a molded layer which is between the first substrate and the second substrate,
wherein the pillar penetrates the molded layer.

6. The semiconductor package of claim 5, wherein a length of the pillar is equal to or greater than a thickness of the molded layer.

7. The semiconductor package of claim 1, further comprising:
a second semiconductor chip,
wherein the second semiconductor chip is between the first substrate and the second substrate, and the second semiconductor chip is connected to the first substrate.

8. The semiconductor package of claim 7, wherein the second semiconductor chip is connected to the first semiconductor chip through the pillar and the first substrate.

9. The semiconductor package of claim 1, wherein
the second substrate includes a wiring and a ground pattern,
the wiring and the ground pattern are at least partially within an interior of the second substrate, and
the antenna pattern and the first semiconductor chip are connected by the wiring.

10. The semiconductor package of claim 9, wherein an upper face of the wiring is exposed on the second face of the second substrate.

11. The semiconductor package of claim 1, further comprising:
an electromagnetic wave shielding film which extends along an upper face and side walls of the first semiconductor chip.

12. The semiconductor package of claim 11, further comprising:
a heat slug which extends along an upper face of the electromagnetic wave shielding film.

13. The semiconductor package of claim 1, further comprising:
a first molded layer between the first substrate and the second substrate; and
a second molded layer between the first molded layer and the first semiconductor chip,
wherein the first semiconductor chip is on the second molded layer,
wherein the pillar penetrates the first and second molded layers and extends to the first substrate.

14. A semiconductor package, comprising:
a first substrate;
a second substrate on the first substrate, the second substrate including a first face facing the first substrate and a second face opposite to the first face;
a first pillar and a second pillar extending from the second face of the second substrate to the first substrate; and
a semiconductor chip on the second face of the second substrate, the semiconductor chip including a first signal terminal, a second signal terminal, and a power terminal,
wherein the second substrate includes an antenna pattern connected to the first signal terminal of the semiconductor chip,
wherein the first pillar is connected to the power terminal, and the second pillar is connected to the second signal terminal.

15. The semiconductor package of claim 14, wherein the antenna pattern is at least partially on a side wall of the second substrate.

16. The semiconductor package of claim 14, wherein the semiconductor chip connects the first signal terminal and the second signal terminal.

17. The semiconductor package of claim 14, further comprising:
an electromagnetic wave shielding film which extends along an upper face and side walls of the semiconductor chip.

18. The semiconductor package of claim 14, wherein a distance between the first signal terminal of the semiconductor chip and the antenna pattern is smaller than a length of at least one of the first pillar or the second pillar.

19. The semiconductor package of claim 14, wherein a thickness of the second substrate is smaller than a thickness of the first substrate.

20. A semiconductor package, comprising:
a first substrate including a first face and a second face opposite to each other;
a plurality of connection terminals on the first face of the first substrate;
a first semiconductor chip and a passive element on the second face of the first substrate;
a molded layer which covers the first semiconductor chip and the passive element, the molded layer being on the second face of the first substrate;
a second substrate on the molded layer, the second substrate including a third face facing the molded layer and a fourth face opposite to the third face;
a plurality of pillars extending from the fourth face of the second substrate to the second face of the first substrate to penetrate the second substrate and the molded layer; and
a second semiconductor chip on the fourth face of the second substrate and connected to the plurality of pillars, wherein a first pillar of the plurality of pillars is connected to the first semiconductor chip and the passive element through the first substrate, wherein a second pillar of the plurality of pillars is connected to one connection terminal of the plurality of connection terminals through the first substrate, wherein the second substrate includes an antenna pattern, a ground pattern, and wiring, wherein the antenna pattern is connected to the second semiconductor chip through the wiring, and the antenna pattern is on the fourth face of the second substrate to be isolated from direct contact with the second semiconductor chip, and wherein the ground pattern is in the second substrate.

* * * * *